United States Patent
Lanting et al.

(10) Patent No.: US 10,454,015 B2
(45) Date of Patent: *Oct. 22, 2019

(54) METHOD OF FORMING SUPERCONDUCTING WIRING LAYERS WITH LOW MAGNETIC NOISE

(71) Applicant: D-Wave Systems Inc., Burnaby (CA)

(72) Inventors: Trevor Michael Lanting, Vancouver (CA); Eric G. Ladizinsky, Manhattan Beach, CA (US); J. Jason Yao, San Ramon, CA (US); Byong Hyop Oh, San Jose, CA (US)

(73) Assignee: D-WAVE SYSTEMS INC., Burnaby (CA)

( * ) Notice: Subject to any disclaimer, the term of this patent is extended or adjusted under 35 U.S.C. 154(b) by 48 days.

This patent is subject to a terminal disclaimer.

(21) Appl. No.: 15/503,367

(22) PCT Filed: Aug. 12, 2015

(86) PCT No.: PCT/US2015/044858
§ 371 (c)(1),
(2) Date: Feb. 10, 2017

(87) PCT Pub. No.: WO2016/025598
PCT Pub. Date: Feb. 18, 2016

(65) Prior Publication Data
US 2018/0219150 A1    Aug. 2, 2018

Related U.S. Application Data

(60) Provisional application No. 62/036,969, filed on Aug. 13, 2014, provisional application No. 62/120,723, filed on Feb. 25, 2015.

(51) Int. Cl.
*H01L 39/24* (2006.01)
*H01L 27/18* (2006.01)
(Continued)

(52) U.S. Cl.
CPC .... *H01L 39/2493* (2013.01); *H01L 21/76891* (2013.01); *H01L 23/53285* (2013.01); *H01L 27/18* (2013.01); *H01L 39/223* (2013.01)

(58) Field of Classification Search
CPC ........... H01L 39/2493; H01L 23/53285; H01L 21/76891; H01L 27/18; H01L 39/223
See application file for complete search history.

(56) References Cited

U.S. PATENT DOCUMENTS 4,689,559 A    8/1987  Hastings et al.
4,912,975 A    4/1990  Ohta et al.
(Continued)

FOREIGN PATENT DOCUMENTS

JP    62-15869 A    1/1987
JP    10-4223 A     1/1998
(Continued)

OTHER PUBLICATIONS

Office Action, dated Apr. 6, 2017, for U.S. Appl. No. 15/289,782, Ladizinsky et al., "Systems and Methods for Fabrication of Superconducting Integrated Circuits," 16 pages.
(Continued)

*Primary Examiner* — Quoc D Hoang
(74) *Attorney, Agent, or Firm* — Cozen O'Connor

(57) ABSTRACT

Fabricating wiring layers above a Josephson junction multilayer may include removing a part of the multilayer; depositing an insulating layer to overlie a part of the multilayer; and patterning the insulating layer to define a hole in the insulating layer. The method includes depositing a first superconducting wiring layer over a part of the insulating layer and within a portion of the hole. Further, insulating and wiring layers may be deposited and a topmost wiring layer defined. The method includes depositing a passivating layer to overlie the topmost wiring layer. Fabricating a supercon-
(Continued)

ducting integrated circuit comprising a hybrid dielectric system may include depositing a high-quality dielectric layer that overlies a superconducting feature. The method includes depositing a second dielectric layer that overlies at least part of the high-quality dielectric layer. The second dielectric layer can comprise a conventional dielectric material.

10 Claims, 18 Drawing Sheets

(51) Int. Cl.
  *H01L 39/22* (2006.01)
  *H01L 21/768* (2006.01)
  *H01L 23/532* (2006.01)

(56) References Cited

U.S. PATENT DOCUMENTS

| | | | |
|---|---|---|---|
| 5,055,158 | A | 10/1991 | Gallagher et al. |
| 5,863,868 | A | 1/1999 | Chan et al. |
| 5,869,846 | A | 2/1999 | Higashino et al. |
| 6,517,944 | B1 | 2/2003 | Puzey et al. |
| 7,135,701 | B2 | 11/2006 | Amin et al. |
| 7,418,283 | B2 | 8/2008 | Amin |
| 7,533,068 | B2 | 5/2009 | Maassen van den Brink et al. |
| 7,638,434 | B2 | 12/2009 | Helneder |
| 8,008,942 | B2 | 8/2011 | van den Brink et al. |
| 8,190,548 | B2 | 5/2012 | Choi |
| 8,195,596 | B2 | 6/2012 | Rose et al. |
| 8,301,214 | B1 | 10/2012 | Tolpygo et al. |
| 8,421,053 | B2 | 4/2013 | Bunyk et al. |
| 8,437,818 | B1 * | 5/2013 | Tolpygo .......... H01L 27/18 505/190 |
| 8,951,808 | B2 | 2/2015 | Ladizinsky et al. |
| 9,136,457 | B2 | 9/2015 | Tolpygo |
| 9,355,362 | B2 | 5/2016 | Shea et al. |
| 9,400,296 | B2 * | 7/2016 | Diewald .......... G01R 21/133 |
| 9,490,296 | B2 | 11/2016 | Ladizinsky et al. |
| 9,978,809 | B2 | 5/2018 | Ladizinsky et al. |
| 2002/0117738 | A1 | 8/2002 | Amin et al. |
| 2005/0107261 | A1 | 5/2005 | Cantor et al. |
| 2007/0194225 | A1 * | 8/2007 | Zorn .......... B82Y 35/00 250/306 |
| 2008/0176750 | A1 | 7/2008 | Rose et al. |
| 2008/0215850 | A1 | 9/2008 | Berkley et al. |
| 2009/0078931 | A1 | 3/2009 | Berkley |
| 2009/0082209 | A1 | 3/2009 | Bunyk et al. |
| 2009/0121215 | A1 | 5/2009 | Choi |
| 2011/0089405 | A1 | 4/2011 | Ladizinsky et al. |
| 2014/0054552 | A1 | 2/2014 | Tolpygo |
| 2015/0046681 | A1 | 2/2015 | King |
| 2015/0187840 | A1 | 7/2015 | Ladizinsky et al. |
| 2015/0236235 | A1 | 8/2015 | Ladizinsky et al. |

FOREIGN PATENT DOCUMENTS

| | | |
|---|---|---|
| JP | 2003-92436 A | 3/2003 |
| KR | 2001-0067425 A | 7/2001 |
| WO | 2009/120638 A2 | 10/2009 |
| WO | 2009/149086 A2 | 12/2009 |
| WO | 2013/180780 A2 | 12/2013 |
| WO | 2013/180780 A3 | 12/2013 |

OTHER PUBLICATIONS

International Search Report and Written Opinion of the International Search Authority, dated Nov. 20, 2015, for International Application No. PCT/US2015/044858, 20 pages.
Ladizinsky et al., "Systems and Methods for Fabrication of Superconducting Integrated Circuits," U.S. Appl. No. 61/156,377, filed Feb. 27, 2009, 89 pages.
Ladizinsky et al., "Systems and Methods for Fabrication of Superconducting Integrated Circuits," U.S. Appl. No. 61/608,379, filed Mar. 8, 2012, 101 pages.
Ladizinsky et al., "Systems and Methods for Fabrication of Superconducting Integrated Circuits," U.S. Appl. No. 61/714,642, filed Oct. 16, 2012, 104 pages.
Ladizinsky et al., "Method of Forming Low-Spread Josephson Junction," U.S. Appl. No. 61/979,406, filed Apr. 14, 2014, 41 pages.
Ladizinsky et al., "Method of Forming Low-Spread Josephson Junction," U.S. Appl. No. 61/987,782, filed May 2, 2014, 43 pages.
Lanting, "Method of Forming Superconducting Wiring Layers With Low Magnetic Noise," U.S. Appl. No. 62/036,969, filed Aug. 13, 2014, 42 pages.
Lanting et al., "Method of Forming Superconducting Wiring Layers With Low Magnetic Noise," U.S. Appl. No. 62/120,723, filed Feb. 25, 2015, 64 pages.
Yao, "Method of Forming Ultra-Small Josephson Junctions," U.S. Appl. No. 61/940,278, filed Feb. 14, 2014, 54 pages.
International Preliminary Report on Patentability dated Feb. 23, 2017, for corresponding International application No. PCT/US2015/044858, 17 pages.
Amendment, filed Jul. 28, 2017, for U.S. Appl. No. 15/289,782, Ladizinsky et al., "Systems and Methods for Fabrication of Superconducting Integrated Circuits," 20 pages.
Amendment, filed Nov. 14, 2017, for U.S. Appl. No. 15/289,782, Ladizinsky et al., "Systems and Methods for Fabrication of Superconducting Integrated Circuits," 12 pages.
Final Office Action, dated Sep. 28, 2017, for U.S. Appl. No. 15/289,782, Ladizinsky et al., "Systems and Methods for Fabrication of Superconducting Integrated Circuits," 17 pages.
International Preliminary Report on Patentability, dated Aug. 30, 2011, for International Application No. PCT/US2010/025403, 5 pages.
Ladizinsky et al, "Systems and Methods for Fabrication of Superconducting Integrated Circuits," U.S. Appl. No. 15/956,404, filed Apr. 18, 2018, 98 pages.
Notice of Allowance, dated Feb. 22, 2018, for U.S. Appl. No. 15/289,782, Ladizinsky et al., "Systems and Methods for Fabrication of Superconducting Integrated Circuits," 5 pages.
Notice of Allowance, dated Jan. 19, 2018, for U.S. Appl. No. 15/289,782, Ladizinsky et al., "Systems and Methods for Fabrication of Superconducting Integrated Circuits," 14 pages.
Preliminary Amendment, filed Apr. 19, 2018, for U.S. Appl. No. 15/956,404, Ladizinsky et al., "Systems and Methods for Fabrication of Superconducting Integrated Circuits," 6 pages.
Preliminary Amendment, filed Jan. 6, 2015, for U.S. Appl. No. 14/589,574, Ladizinsky et al., "Systems and Methods for Fabrication of Superconducting Integrated Circuits," 9 pages.
Preliminary Amendment, filed Nov. 10, 2010, for U.S. Appl. No. 12/992,049, Ladizinsky et al., "Systems and Methods for Fabrication of Superconducting Integrated Circuits," 3 pages.
Preliminary Amendment, filed Oct. 11, 2016, for U.S. Appl. No. 15/289,782, Ladizinsky et al., "Systems and Methods for Fabrication of Superconducting Integrated Circuits," 9 pages.
Amendment, Systems and Methods for Fabrication of Superconducing Integrated Circuits, for Ladizinsky et al., U.S. Appl. No. 12/992,049, filed Mar. 13, 2013, 23 pages.
Amendment, Systems and Methods for Fabrication of Superconducing Integrated Circuits, for Ladizinsky et al., U.S. Appl. No. 12/992,049, filed Apr. 15, 2014,13 pages.
Amendment, Systems and Methods for Fabrication of Superconducing Integrated Circuits, for Ladizinsky et al., U.S. Appl. No. 12/992,049, filed Aug. 20, 2013, 17 pages.
Amendment, Systems and Methods for Fabrication of Superconducing Integrated Circuits, for Ladizinsky et al., U.S. Appl. No. 12/992,049, filed Nov. 4, 2013, 17 pages.
Amendment, Systems and Methods for Fabrication of Superconducing Integrated Circuits, for Ladizinsky et al., U.S. Appl. No. 14/589,574, filed Jun. 14, 2016, 9 pages.
Gordy et al., "Microwave Spectroscopy," Table A.2, John Wiley and Sons, Inc., New York, New York, pp. 337-344, 1953.
Hinode et al., "Fabrication of Reliable Via Conductors for Niobium SFQ Devices" *Physica C 426-431*:1533-1540, 2005.

(56) References Cited

OTHER PUBLICATIONS

International Search Report, dated Sep. 28, 2010, for International Application No. PCT/US2010/025403, 3 pages.
Nagasawa et al., "Development of Advanced Nb Process for SFQ Circuits," *Physica C 412-414*:1429-1436, 2004.
Notice of Allowance, Systems and Methods for Fabrication of Superconducing Integrated Circuits, for Ladizinsky et al., U.S. Appl. No. 12/992,049, dated Sep. 26, 2014, 5 pages.
Notice of Allowance, Systems and Methods for Fabrication of Superconducing Integrated Circuits, for Ladizinsky et al., U.S. Appl. No. 14/589,574, dated Jul. 18, 2016, 9 pages.
Office Action, Systems and Methods for Fabrication of Superconducing Integrated Circuits, for Ladizinsky et al., U.S. Appl. No. 12/992,049, dated Jan. 29, 2014, 8 pages.
Office Action, Systems and Methods for Fabrication of Superconducing Integrated Circuits, for Ladizinsky et al., U.S. Appl. No. 12/992,049, dated May 22, 2013, 7 pages.
Office Action, Systems and Methods for Fabrication of Superconducing Integrated Circuits, for Ladizinsky et al., U.S. Appl. No. 12/992,049, dated Dec. 14, 2012, 9 pages.
Office Action, Systems and Methods for Fabrication of Superconducing Integrated Circuits, for Ladizinsky et al., U.S. Appl. No. 14/589,574, dated Mar. 14, 2016, 33 pages.
Preliminary Amendment, Systems and Methods for Fabrication of Superconducing Integrated Circuits, for Ladizinsky et al., U.S. Appl. No. 12/992,049, filed Jun. 20, 2011, 3 pages.
Preliminary Amendment, Systems and Methods for Fabrication of Superconducing Integrated Circuits, for Ladizinsky et al., U.S. Appl. No. 15/289,782, filed Dec. 20, 2016, 8 pages.
Response to Restriction Requirement, Systems and Methods for Fabrication of Superconducing Integrated Circuits, for Ladizinsky et al., U.S. Appl. No. 12/992,049, filed Oct. 10, 2012, 3 pages.
Restriction Requirement, Systems and Methods for Fabrication of Superconducing Integrated Circuits, for Ladizinsky et al., U.S. Appl. No. 12/992,049, dated Sep. 13, 2012, 4 pages.
Satoh et al., "Planarization of Josephson Junctions for Large-Scale Integrated Nb SFQ Circuits by Mechanical Polishing," *Physica C 412-414*:1447-1450, 2004.
Satoh et al., "Fabrication Process of Planarized Multi-Layer Nb Integrated Circuits," *IEEE Transactions on Applied Superconductivity* 15(2):78-81, 2005.
"Superconducting Technology Assessment," National Security Agency Office of Corporate Assessments, 257 pages, Aug. 2005.
Vinante et al., "Hot-Electron Effect in Palladium Thin Films," *Physical Review B 75*:104303-1-104303-5, 2007.
Written Opinion of the International Searching Authority, dated Sep. 28, 2010, for International Application No. PCT/US2010/025403, 4 pages.

* cited by examiner

METHOD OF FORMING SUPERCONDUCTING WIRING LAYERS WITH LOW MAGNETIC NOISE

BACKGROUND

Technical Field

The present systems and methods relate to the fabrication of superconducting integrated circuits that include Josephson junctions and a plurality of wiring layers.

Josephson Junctions

A Josephson junction is a common element in superconducting integrated circuits. Physically, a Josephson junction is a small interruption in an otherwise continuous superconducting current path, typically realized by a thin insulating barrier sandwiched in between two superconducting electrodes. In superconducting integrated circuits, Josephson junctions are typically fabricated as a stack comprising a superconducting base electrode overlaid with a thin insulating layer, which is then overlaid with a superconducting counter electrode. Thus, a Josephson junction is usually formed as a three-layer, or "trilayer," structure. A trilayer may be deposited completely over an entire wafer (i.e., in the same way that metal wiring and dielectric layers are deposited) and then patterned to define individual Josephson junctions.

Integrated Circuit Fabrication

Traditionally, the fabrication of superconducting integrated circuits has not been performed at state-of-the-art semiconductor fabrication facilities. This may be due to the fact that some of the materials used in superconducting integrated circuits can contaminate the semiconductor facilities. For instance, gold may be used as a resistor in superconducting circuits, but gold can contaminate a fabrication tool used to produce complementary metal-oxide-semiconductor (CMOS) wafers in a semiconductor facility. Consequently, superconducting integrated circuits containing gold are typically not processed by tools that also process CMOS wafers.

Superconductor fabrication has typically been performed in research environments where standard industry practices could be optimized for superconducting circuit production. Superconducting integrated circuits are often fabricated with tools that are traditionally used to fabricate semiconductor chips or integrated circuits. Owing to issues peculiar to superconducting circuits, not all semiconductor processes and techniques are necessarily transferable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Any impurities within superconducting chips may result in noise which can compromise or degrade the functionality of the individual devices, such as superconducting qubits, and of the superconducting chip as a whole. Since noise is a serious concern to the operation of quantum computers, measures should be taken to reduce dielectric noise wherever possible.

Etching

Etching removes layers of, for example, substrates, dielectric layers, oxide layers, electrically insulating layers and/or metal layers according to desired patterns delineated by photoresists or other masking techniques. Two exemplary etching techniques are wet chemical etching and dry chemical etching.

Wet chemical etching or "wet etching" is typically accomplished by submerging a wafer in a corrosive bath such as an acid bath. In general, etching solutions are housed in polypropylene, temperature-controlled baths. The baths are usually equipped with either a ring-type plenum exhaust ventilation or a slotted exhaust at the rear of the etch station. Vertical laminar-flow hoods are typically used to supply uniformly-filtered, particulate-free air to the top surface of the etch baths.

Dry chemical etching or "dry etching" is commonly employed due to its ability to better control the etching process and reduce contamination levels. Dry etching effectively etches desired layers through the use of gases, either by chemical reaction such as using a chemically reactive gas or through physical bombardment, such as plasma etching, using, for example, argon atoms.

Plasma etching systems have been developed that can effectively etch, for example, silicon, silicon dioxide, silicon nitride, aluminum, tantalum, tantalum compounds, chromium, tungsten, gold, and many other materials. Two types of plasma etching reactor systems are in common use—the barrel reactor system and the parallel plate reactor system. Both reactor types operate on the same principles and vary primarily in configuration. The typical reactor consists of a vacuum reactor chamber made usually of aluminum, glass, or quartz. A radiofrequency or microwave energy source (referred to collectively as RF energy source) is used to activate etchants, for example, fluorine-based or chlorine-based gases. Wafers are loaded into the chamber, a pump evacuates the chamber, and the reagent gas is introduced. The RF energy ionizes the gas and forms the etching plasma, which reacts with the wafers to form volatile products which are pumped away.

Physical etching processes employ physical bombardment. For instance, argon gas atoms may be used to physically bombard a layer to be etched, and a vacuum pump system removes dislocated material. Sputter etching is one physical technique involving ion impact and energy transfer. The wafer to be etched is attached to a negative electrode, or "target," in a glow-discharge circuit. Positive argon ions bombard the wafer surface, resulting in the dislocation of the surface atoms. Power is provided by an RF energy source. Ion beam etching and milling are physical etching processes which use a beam of low-energy ions to dislodge material. The ion beam is extracted from an ionized gas (e.g., argon or argon/oxygen) or plasma, created by an electrical discharge.

Reactive-ion etching (RIE) is a combination of chemical and physical etching. During RIE, a wafer is placed in a chamber with an atmosphere of chemically reactive gas (e.g., $CF_4$, $CCl_4$ and many other gases) at a low pressure. An electrical discharge creates an ion plasma with an energy of a few hundred electron volts. The ions strike the wafer surface vertically, where they react to form volatile species that are removed by the low pressure in-line vacuum system.

Planarization

The use of chemical-mechanical planarization (CMP) allows for a near flat surface to be produced. CMP is a standard process in the semiconductor industry. The CMP process uses an abrasive and corrosive chemical slurry in conjunction with a polishing pad and retaining ring, typically of a greater width than the wafer. The pad and wafer are pressed together by a dynamic polishing head and held in place by a plastic retaining ring. The dynamic polishing head is rotated with different axes of rotation (i.e., not concentric). This removes material and tends to even out any irregular topography, making the wafer flat or planar. The process of material removal is not simply that of abrasive scraping, like sandpaper on wood. The chemicals in the slurry also react with and/or weaken the material to be removed such that certain materials can be preferentially removed while leaving others relatively intact. The abrasive accelerates this weakening process and the polishing pad helps to wipe the reacted materials from the surface. Advanced slurries can be used to preferentially remove areas of the wafer that are relatively high or protrude in relation to areas of the wafer that are relatively low in order to planarize the topography of the wafer.

Plasma Oxidation

Plasma oxidation is an electrochemical surface treatment process for generating oxide coatings on metals. An electromagnetic source can be used to transform oxygen gas into oxygen plasma that is directed toward a metallic object. When the resulting oxygen plasma is applied to a surface of a metal, an oxide coating grows on the surface of the metal. The coating is a chemical conversion of the metal into its oxide, which grows both inwardly and outwardly from the surface of the metal. Because the oxide coating is nonconductive, plasma oxidation can be employed to passivate the surface of the metal.

Nitridization

Nitriding processes may be employed to diffuse nitrogen into the surface of a metal. Examples of nitriding processes include gas nitriding, salt bath nitriding, and plasma nitriding. A nitrogen-rich gas, such as ammonia ($NH_3$) gas, may be used in a gas nitriding process. For example, when ammonia gas comes into contact with a heated metal, it disassociates into hydrogen and nitrogen, which diffuses onto the surface of the metal forming a nitride layer. A nitrogen-containing salt (e.g., cyanide salt) may be used in a salt bath nitriding process that causes the salt to donate nitrogen and carbon to the surface of the metal. Salt bath nitriding processes are typically performed in a temperature range of approximately 550-590° C. Plasma nitriding processes generate intense electric fields to ionize molecules of a gas that includes nitrogen (e.g., pure nitrogen gas) around the surface of a metal to form a nitride layer on the surface of the metal. Plasma nitriding processes may be performed inside vacuum chambers at low-pressures.

Anodization

Anodizing processes are electrolytic passivation processes that may be employed to increase the thickness of an oxide layer on the surface of a metal. Such processes are called anodizing processes because the metal to be treated forms the anode electrode (i.e., positive electrode) of an electrical circuit that includes an electrolytic solution. An electric power source passes a current (e.g., direct current) through the electrical circuit that includes an electrolytic solution and the metal serving as the anode of the electrical circuit. The current releases hydrogen at the cathode (i.e., negative electrode) and oxygen at the surface of the metal (i.e., anode electrode), which forms a layer of a metallic oxide on the metal. The thickness of the oxide layer depends on the magnitude of the voltage and the amount of time the voltage is applied to the electrical circuit.

Photolithography

Photolithography, also termed optical lithography or UV lithography, is a process used in microfabrication to pattern parts of a thin film or the bulk of a substrate. It uses light to transfer a geometric pattern from a photomask to a light-sensitive chemical photoresist on the substrate. A series of chemical treatments then either engraves the exposure pattern into, or enables deposition of a new material in the desired pattern upon, the material underneath the photoresist. For example, in complex integrated circuits, a modern CMOS wafer will go through the photolithographic cycle up to 50 times.

Photolithography shares some fundamental principles with photography in that the pattern in the photoresist is created by selectively exposing the photoresist to light as defined by an optical mask. Compared to photography the optical mask is like the negative and the photo resist is the light sensitive silver halide material in photographic paper. Extremely small patterns (down to a few tens of nanometers in size) can be created. These techniques afford exact control over the shape and size of the feature on the substrate.

BRIEF SUMMARY

A method of fabricating a Josephson junction may be summarized as including depositing an inner superconductive layer, the inner superconductive layer comprising a material that is superconductive in a range of critical temperatures; forming an oxide layer that overlies at least part of the inner superconductive layer; depositing an outer superconductive layer to overlie at least part of the oxide layer, the outer superconductive layer comprising a material that is superconductive in a range of critical temperatures; removing a portion of the outer superconductive layer to form at least one structure from the outer superconductive layer; depositing a first insulating layer to overlie a part of the outer superconductive layer; removing a portion of the first insulating layer to define a first hole through the first insulating layer; depositing a first superconducting wiring layer to overlie a portion of the first insulating layer and within a portion of the first hole, wherein first superconducting wiring layer comprising a material that is superconductive in a range of critical temperatures; removing a portion of the first superconducting wiring layer; depositing a second insulating layer to overlie a part of the first superconducting wiring layer; depositing a top superconducting wiring layer to overlie a portion of the second insulating layer; removing a portion of the top superconducting wiring layer; and depositing a passivating layer to overlie a part of the top superconducting wiring layer. Depositing a passivating layer to overlie a part of the top superconducting wiring layer may include depositing an insulating layer on the part of the top superconducting layer. Depositing an insulating layer on the part of the top superconducting wiring layer may include depositing an oxide on the part of the top superconducting layer. Depositing a passivating layer to overlie a part of the top superconducting wiring layer may include depositing a superconducting metal on the part of the top superconducting layer. Depositing a superconducting metal on the part of the top superconducting layer may include depositing aluminum on the part of the top superconducting layer.

Depositing a first insulating layer to overlie a part of the outer superconductive layer may include depositing a first dielectric to overlie a part of the outer superconductive layer; and depositing a second dielectric to overlie at least part of the first dielectric. The first dielectric may include silicon nitride and the second dielectric may include silicon dioxide.

Depositing a second insulating layer to overlie a part of the first superconducting wiring layer may include depositing a first dielectric to overlie a part of the first superconducting wiring layer; and depositing a second dielectric to overlie at least part of the first dielectric. The first dielectric may include silicon nitride and the second dielectric may include silicon dioxide.

Depositing a passivating layer to overlie a part of the top superconducting wiring layer may include depositing a first dielectric to overlie a part of the first superconducting wiring layer; and depositing a second dielectric to overlie at least part of the first dielectric.

A manufacture may be summarized as including a substrate; a Josephson junction multi-layer overlying the substrate; a plurality of superconducting wiring layers overlying the Josephson junction multi-layer, wherein the plurality of superconducting wiring layers comprise material that is superconductive in a range of critical temperatures; a top superconducting wiring layer in the plurality of superconducting wiring layers, wherein the top superconducting wiring layer is spaced relatively outward of the plurality of superconducting wiring layers with respect to the substrate; and a passivating layer overlying the top wiring layer. The passivating layer overlying the top wiring layer may include an insulating layer, an oxide, or a superconducting metal layer such as aluminum.

A manufacture may be summarized as including a substrate; a Josephson junction multi-layer overlying the substrate; a plurality of superconducting wiring layers overlying the Josephson junction multi-layer, wherein the plurality of superconducting wiring layers comprise material that is superconductive in a range of critical temperatures; the plurality of superconducting wiring layers comprising a top superconducting wiring layer and at least one inner superconducting wiring layer, the top superconducting wiring layer is positioned relatively outward of all other ones of the plurality of superconducting wiring layers with respect to the substrate; the inner superconducting wiring layer is positioned relatively inward of the top superconducting wiring layer with respect to the substrate; and a passivating layer overlying the inner superconducting wiring layer.

The passivating layer overlying the inner superconducting wiring layer may include an insulating layer, an oxide, or a superconducting metal layer such as aluminum.

The Josephson junction multi-layer may further include an inner superconductive layer, the inner superconductive layer comprising a material that is superconductive in a range of critical temperatures; a first oxide layer that overlies at least part of the inner superconductive layer; and a superconductive structure that overlies at least part of the oxide layer, the superconductive structure comprising a material that is superconductive in a range of critical temperatures.

The manufacture may further include at least one dielectric layer that overlies the substrate wherein the at least one dielectric layer comprises at least two dielectrics.

The manufacture may further include a first dielectric that overlies the substrate; a superconductive layer that overlies at least part of the first dielectric, the superconductive layer comprising a material that is superconductive in a range of critical temperatures; a second dielectric that overlies at least part of the superconducting layer; and a third dielectric that overlies at least part of the second dielectric. At least one of the first dielectric and the third dielectric may include silicon dioxide and the second dielectric may include silicon nitride.

A method of fabricating a superconducting integrated circuit may be summarized as including depositing a first dielectric that overlies a substrate; depositing a superconductive layer that overlies at least part of the first dielectric, the superconductive layer comprising a material that is superconductive in a range of critical temperatures; patterning the superconducting layer to create at least one superconducting feature; depositing a second dielectric that overlies at least part of the at least one superconducting feature; and depositing a third dielectric that overlies at least part of the second dielectric.

The method may further include planarizing the third dielectric to a determined thickness. At least one of the first dielectric and the third dielectric may include silicon dioxide and the second dielectric may include silicon nitride.

A method of fabricating a superconducting integrated circuit may be summarized as including depositing a first dielectric that overlies a substrate; depositing a superconductive layer that overlies at least part of the first dielectric, the superconductive layer comprising a material that is superconductive in a range of critical temperatures; depositing a second dielectric that overlies the superconductive layer; patterning the second dielectric layer and the superconducting layer to create at least one superconducting feature, the at least one superconducting feature comprising a dielectric cap; depositing a third dielectric that overlies at least part of the at least one superconducting feature; and depositing a fourth dielectric that overlies at least part of the third dielectric.

The method may further include planarizing the fourth dielectric to a determined thickness. At least one of the first dielectric and the fourth dielectric may include silicon dioxide and at least one of the second dielectric and the third dielectric may include silicon nitride.

A method of fabricating a superconducting integrated circuit may be summarized as including depositing a first dielectric that overlies a substrate; depositing a superconductive layer that overlies at least part of the first dielectric, the superconductive layer comprising a material that is superconductive in a range of critical temperatures; patterning the superconducting layer to create at least one superconducting feature, the at least one superconducting feature; depositing a second dielectric that overlies at least part of the at least one superconducting feature; depositing a third dielectric that overlies at least part of the second dielectric; polishing the third dielectric to expose at least part of the at least one superconducting feature; depositing a fourth dielectric that overlies at least part of the at least one superconducting feature; and depositing a fifth dielectric that overlies at least part of the fourth dielectric.

The method may further include planarizing the fifth dielectric to a determined thickness.

At least one of the first dielectric, the third dielectric and the fifth dielectric may include silicon dioxide and at least one of the second dielectric and the fourth dielectric may include silicon nitride.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

Figure 1:
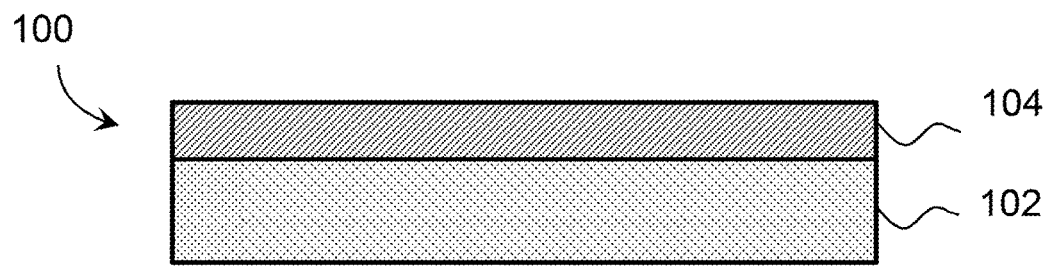
FIGS. 1 through 12 are each respective cross-sectional representations of a superconducting integrated circuit at sequential phases of a fabrication process, according to one illustrated embodiment.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with superconductive circuits or structures, quantum computer circuits or structures and/or fabrication tools and processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Unless the specific context requires otherwise, throughout this specification the terms "deposit," "deposited," "deposition," and the like are generally used to encompass any method of material deposition, including but not limited to physical vapor deposition (PVD), chemical vapor deposition (CVD), plasma-enhanced PVD, plasma-enhanced CVD, and atomic layer deposition (ALD).

The various embodiments described herein provide systems and methods for fabricating superconducting integrated circuits. As previously described, in the art superconducting integrated circuits tend to be fabricated in research environments outside of state-of-the-art semiconductor fabrication facilities, even though superconducting integrated circuits are typically fabricated using many of the same tools and techniques that are traditionally used in the semiconductor fabrication industry. Due to issues unique to superconducting circuits, semiconductor processes and techniques generally need to be modified for use in superconductor chip and circuit fabrication. Such modifications typically are not obvious and may require some experimentation.

Figure 13:
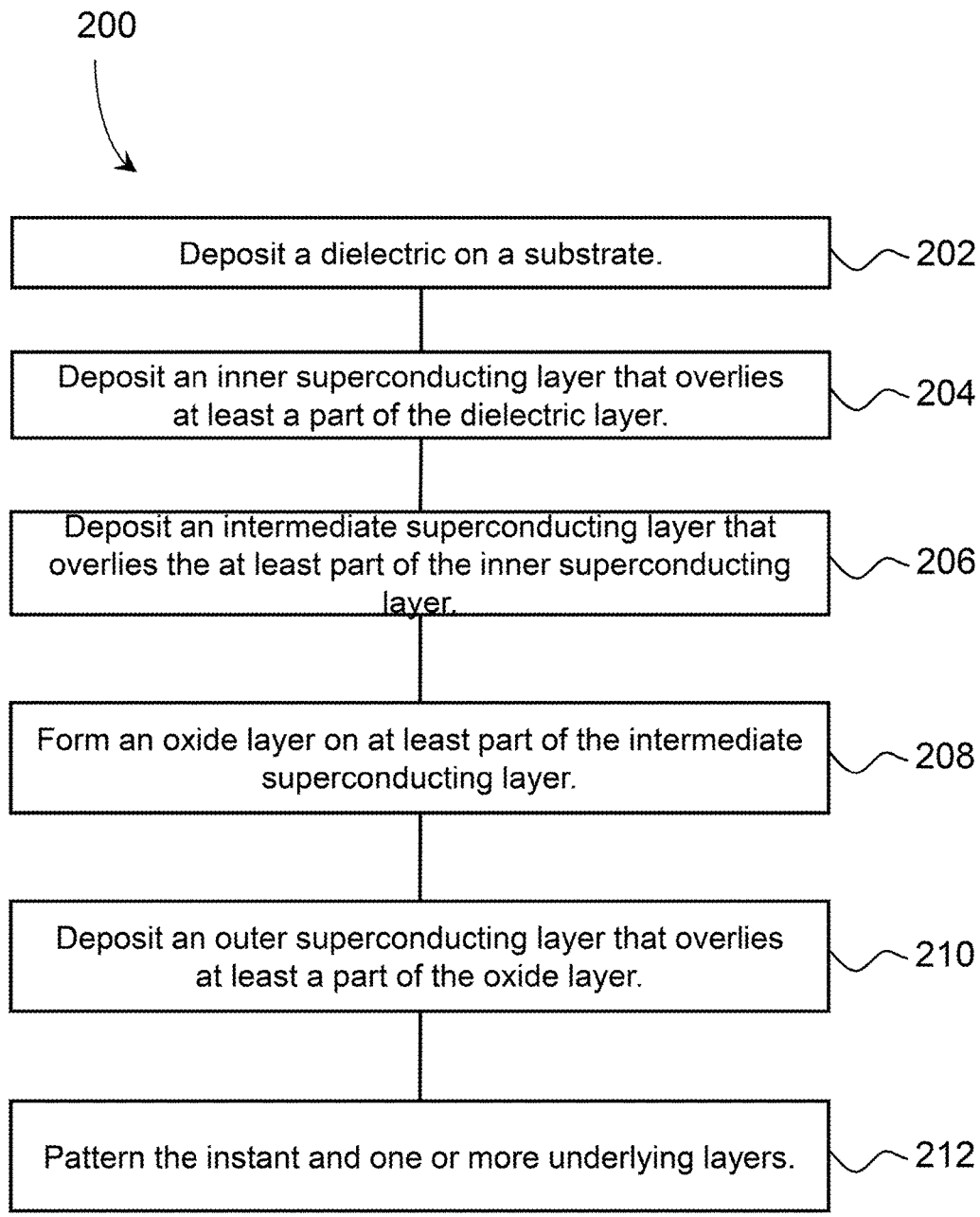
FIG. 13 is a flow diagram showing a fabrication method to produce the structures illustrated in FIGS. 1 through 7, according to one illustrated embodiment.
Figure 14:
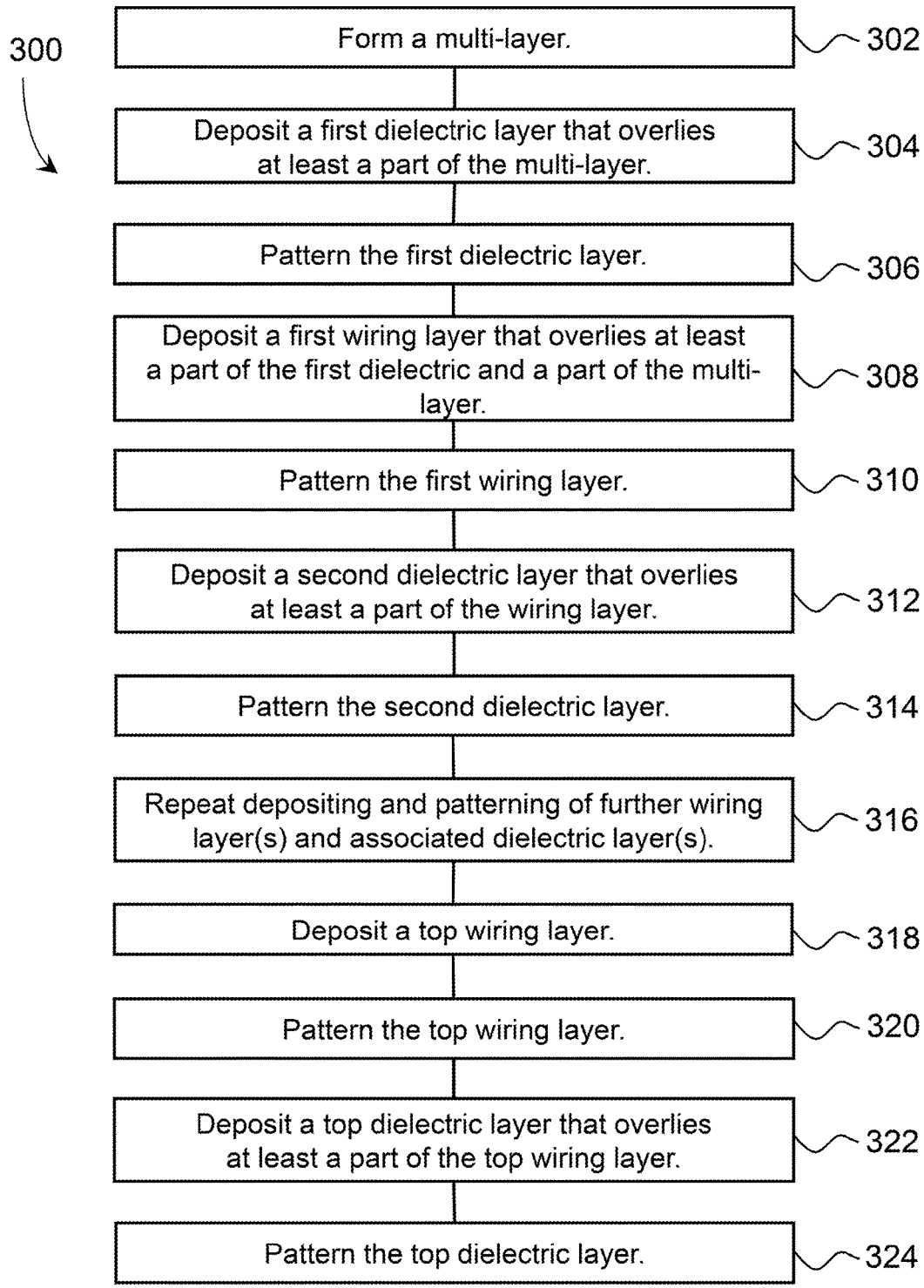
FIG. 14 is a flow diagram showing a fabrication method to produce the structures illustrated in FIGS. 1 through 12, according to one illustrated embodiment.

FIGS. 1 through 12 are representations of formation of an integrated circuit 100 at different successive phases of a fabrication process, according to one illustrated embodiment. FIGS. 13 and 14 show fabrication methods to produce the intermediate and end structures illustrated in FIGS. 1 through 12, according to one illustrated embodiment.

The integrated circuit 100 includes at least a substrate, a Josephson junction multi-layer, a plurality of wiring layers, and an insulating layer overlying the top wiring layer. The Josephson junction multi-layer includes an inner superconducting layer, an outer superconducting layer, and optionally one or more intermediate superconducting layers. The term inner is used to denominate that the respective superconducting layer is spaced relatively inward of the outer superconducting layer with respect to the substrate. The term outer is used to denominate that the respective superconducting layer is spaced relatively outward of the inner superconducting layer with respect to the substrate. The term intermediate is used to denominate that the respective superconducting layer is spaced between the inner and the outer superconducting layers. The inner superconducting layer is denominated as the base electrode and the outer superconducting layer is denominated as the counter electrode.

The method may be used to fabricate superconductor structures, e.g., niobium (Nb) and aluminum (Al) based Josephson junctions and associated wiring layers. In one embodiment, superconducting integrated circuit fabrication processes, such as lithographic pattern definition and RIE, including wiring layer fabrication are followed by an application of a passivating layer, for example, an insulating layer or a superconducting layer, to overlie the topmost wiring layer. This passivating layer has the unexpected result of reducing the pink noise (also known as 1/f or flicker noise) present in systems including the integrated circuits. Pink noise is noise with a power spectral density of the form PSD(f)∝1/F where f is frequency and a is a fitted exponent between 0 and 2 and normally close to 1. It can be beneficial to reduce pink noise by applying a passivating layer to overlie a wiring layer such as the topmost wiring layer.

Referring now to FIGS. 1 and 13, semiconductor fabrication equipment deposits a dielectric layer 104 over (e.g., on) at least part of a substrate 102 at 202. For example, the semiconductor fabrication equipment employs a CVD process to deposit the dielectric layer 104 on the substrate 102. In one embodiment, the substrate 102 is comprised of silicon and the first dielectric layer 104 is comprised of silicon dioxide. In one embodiment, semiconductor fabrication equipment planarizes the first dielectric layer 104 at 202. For example, the semiconductor fabrication equipment employs a CMP process to planarize the first dielectric layer 104.

If the substrate 102 is formed from a non-conductive material (e.g., sapphire), it may not be desirable to form the first dielectric layer 104 at 202. Accordingly, in at least one implementation, the acts described above in connection with 202 are not performed.

Figure 2:
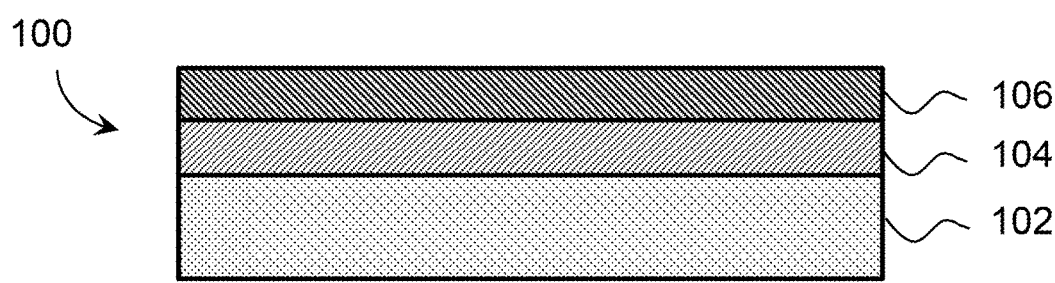

At 204, semiconductor fabrication equipment deposits an inner superconductive layer 106 that superconducts in a range of critical temperatures over (e.g., on) at least part of the dielectric layer 104, as shown in FIG. 2. For example, the semiconductor fabrication equipment employs a CVD process to deposit the inner superconductive layer 106 on the dielectric layer 104. In one embodiment, the inner superconductive layer 106 is comprised of niobium. In one embodiment, semiconductor fabrication equipment planarizes the inner superconductive layer 106 at 204. For example, the semiconductor fabrication equipment employs a CMP process to planarize the inner superconductive layer 106.

Figure 3:
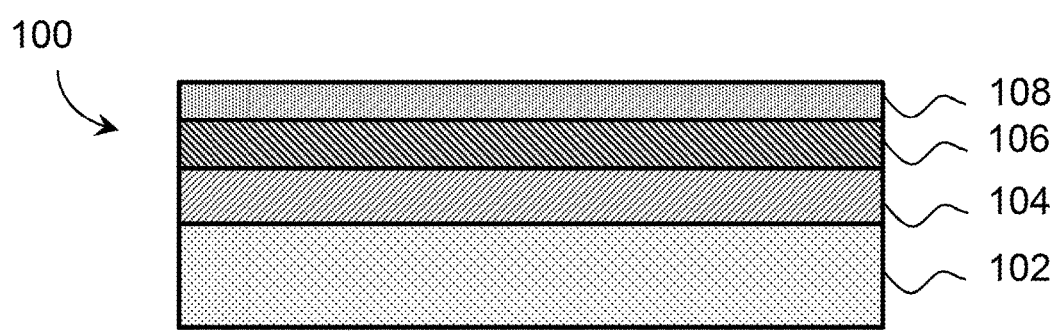

At 206, semiconductor fabrication equipment deposits an intermediate superconductive layer 108 that superconducts in a range of critical temperatures over at least part of the inner superconductive layer 106, as shown in FIG. 3. For example, the semiconductor fabrication equipment employs a CVD process to deposit the intermediate superconductive layer 108 on the inner superconductive layer 106. In one embodiment, the intermediate superconductive layer 108 is comprised of aluminum. In one embodiment, semiconductor fabrication equipment planarizes the intermediate superconductive layer 108 at 206. For example, the semiconductor fabrication equipment employs a CMP process to planarize the intermediate superconductive layer 108. In at least one implementation, the acts described above in connection with 206 are not performed. That is, the intermediate superconductive layer 108 is optional in one or more implementations.

Figure 4:
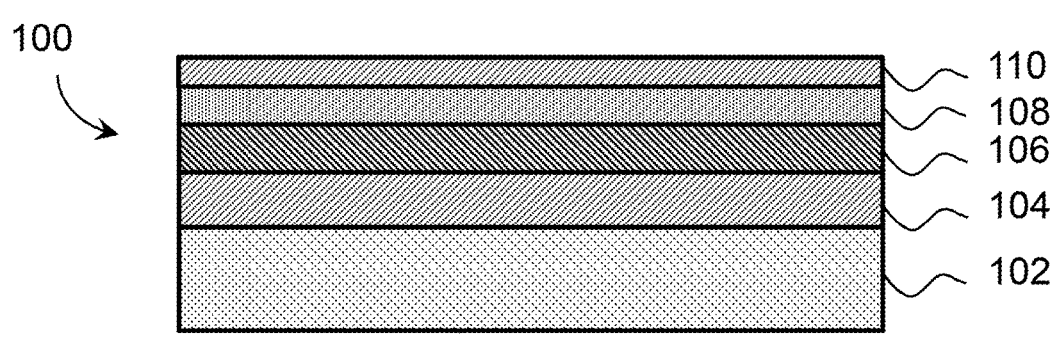

At 208, semiconductor fabrication equipment forms an oxide layer 110 on the intermediate superconductive layer 108, as shown in FIG. 4. The semiconductor fabrication equipment may form the oxide layer 110 by exposing the intermediate superconductive layer 108 to a predetermined concentration of oxygen gas for a predetermined amount of time at a predetermined temperature and a predetermined pressure to form a desired thickness of the oxide layer 110. In one embodiment, the oxide layer 110 is comprised of aluminum oxide (i.e., $Al_2O_3$). In one implementation, the concentration of oxygen gas used to form the oxide layer 110 at 208 is 100% pure oxygen. The oxidation time may be in a range from one minute to hundreds of minutes at room temperature, at a pressure that may range from milli-Torr to tens of Torrs. The desired thickness of the oxide layer 110 is on the order of a few angstroms to tens of angstroms.

If the acts described above in connection with 206 are not performed (i.e., the intermediate superconductive layer 108 is not formed), the semiconductor fabrication equipment forms the oxide layer 110 on the inner superconductive layer 106 at 208. Accordingly, in one implementation the oxide layer 110 is comprised of niobium oxide (e.g., NbO, $NbO_2$, or $Nb_2O_5$).

Figure 5:
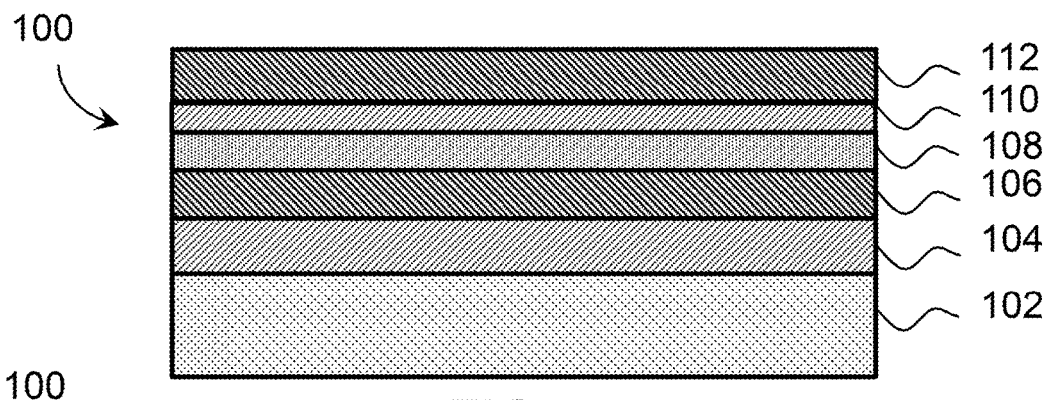

At 210, semiconductor fabrication equipment deposits an outer superconductive layer 112, that superconducts in a range of critical temperatures, over (e.g., on) at least part of the oxide layer 110, as shown in FIG. 5. For example, the semiconductor fabrication equipment employs a CVD process to deposit the outer superconductive layer 112 on the oxide layer 110. In one embodiment, the outer superconductive layer 112 is comprised of matching material (e.g., material of the same type) to the inner superconducting layer. For example, when the inner superconductive layer 106 is comprised of niobium then the outer superconductive layer 112 is comprised of niobium. In one embodiment, semiconductor fabrication equipment planarizes the outer superconductive layer 112 at 210. For example, the semiconductor fabrication equipment employs a CMP process to planarize the outer superconductive layer 112.

Figure 6:
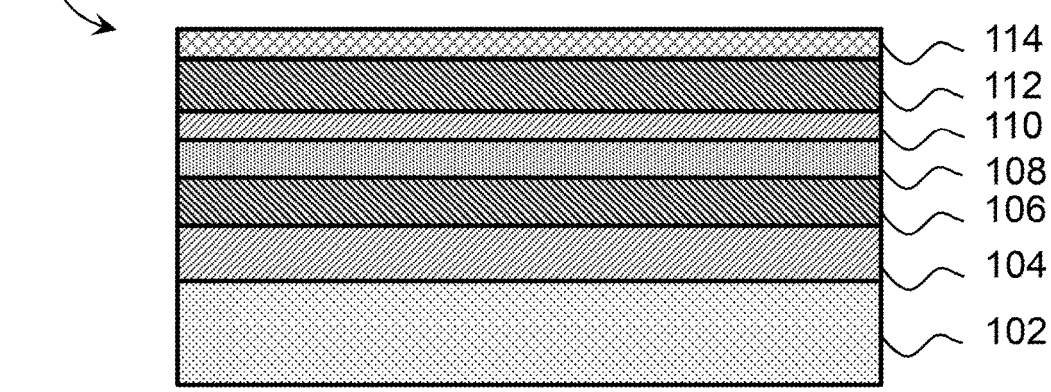

At 212, semiconductor fabrication equipment patterns one or more of the previously formed layers. For example, semiconductor fabrication equipment forms a mask layer 114 over (e.g., on) at least part of the outer superconductive layer 112, as shown in FIG. 6. For example, the semiconductor fabrication equipment deposits a photoresist material on an upper surface of the outer superconductive layer 112 and then selectively irradiates desired portions of the photoresist material to form the mask layer 114.

Still at 212, semiconductor fabrication equipment removes a portion of the mask layer 114. For example, the semiconductor fabrication equipment washes away a portion of the photoresist material that was not irradiated with UV light at 212 using a developer fluid.

Figure 7:
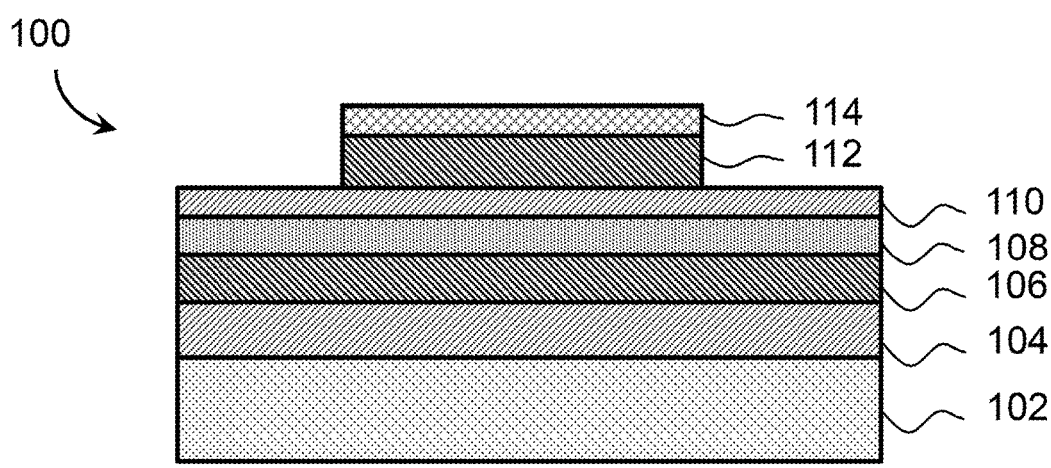

At 212, semiconductor fabrication equipment removes a portion of the outer superconductive layer 112 (shown in FIG. 7), portions of the outer superconductive layer 112, oxide layer 110, and intermediate superconductor layer 108 (not shown), or portions of the outer superconductive layer 112, oxide layer 110 and intermediate superconductor layer 108, and inner superconductive layer 106 (not shown) to form a structure (e.g., a junction). For example, the semiconductor fabrication equipment performs a Reactive-Ion Etching (RIE) process, which employs chemically-reactive plasma, to remove a portion of the outer superconductive layer 112 stopping at the oxide layer 110 as shown in FIG. 7.

The remaining portion of the mask can be removed by a strip process. For example, the material 114 may be removed by the application of oxygen plasma. For niobium, wiring some examples use oxygen ($O_2$) plasma heated to 45° C. applied for 90 seconds. However, an $O_2$ plasma on its own may not be sufficient to remove some of the polymers that result from the adhesion of the photoresist mask to the niobium metal. In some implementations, a modified photoresist-stripping process may employ a combination of $CF_4$ and $O_2$ plasma to more reliably remove photoresist mask residue (e.g., polymers formed by interactions between the photoresist mask and the niobium metal) from the surface of niobium metal.

FIGS. 1 through 7, and 13 illustrate and describe the formation of a trilayer, and example of a multilayer Josephson junction structure. Other examples of a multilayer Josephson junction structure include a pentalayer. A method of fabricating a Josephson junction pentalayer may be summarized as including depositing a first superconducting metal layer; depositing a first insulating barrier over the first superconducting metal layer, wherein the first insulating barrier has a first thickness; depositing a second superconducting metal layer over the first insulating barrier; depositing a second insulating barrier over the second superconducting metal layer, wherein the second insulating barrier has a second thickness that is different from the first thickness of the first insulating barrier; and depositing a third superconducting metal layer over the second insulating barrier. Depositing a second insulating barrier over the second superconducting metal layer, wherein the second insulating barrier has a second thickness that is different from the first thickness of the first insulating barrier, may include depositing a second insulating barrier over the second superconducting metal layer, wherein the second insulating barrier has a second thickness that is larger than the first thickness of the first insulating barrier. See WO Patent Application Publication No. WO2013180780 A3.

Figure 8:
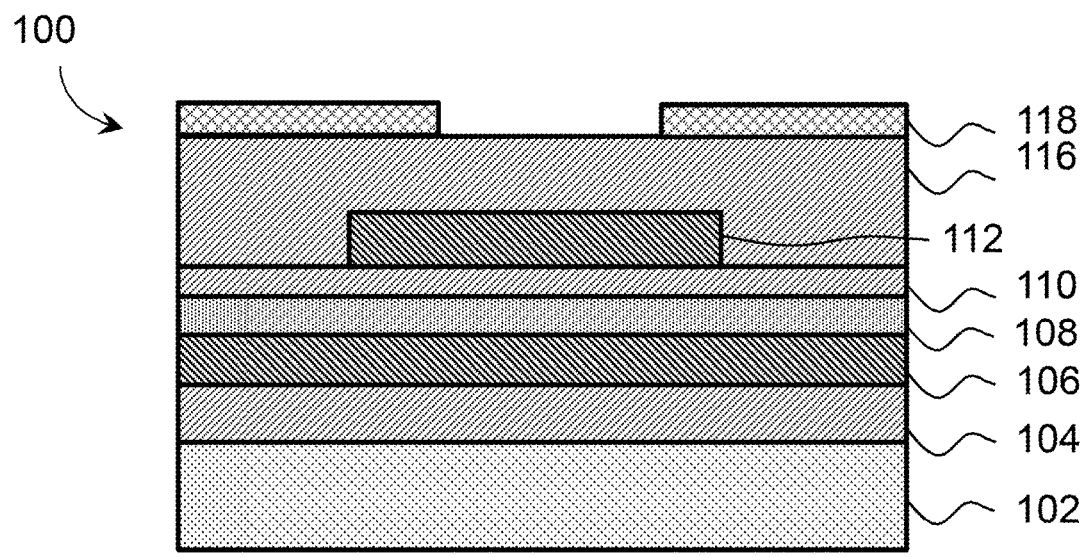

FIGS. 8 through 12, and 14 illustrate and describe the formation of a plurality of wiring layers that overlie a Josephson junction multilayer. Referring now to FIGS. 8 and 14, at 302 a multilayer is formed, for example as described herein. At 304 semiconductor fabrication equipment deposits a first dielectric layer 116 over (e.g., on) at least part of the outer superconducting layer 112. At 306, the semiconductor fabrication equipment can pattern the dielectric layer 116. As shown in FIG. 8, the semiconductor fabrication equipment deposits a photo resists and creates a mask 118, for example using a process as described above. Semiconductor fabrication equipment, like for layer 112 etches away portions of the dielectric layer 116, removing the mask, and the like. This creates or defines one or more voids (or holes) within dielectric layer 116. These voids can be used to form vias. Vias are used to connect two layers together. In some examples, the vias have a round cross-sectional profile. In some examples, the vias are 0.5 micrometers to 0.7 micrometers in diameter. In some examples, the vias are different shapes with comparable characteristic dimensions.

Figure 9:
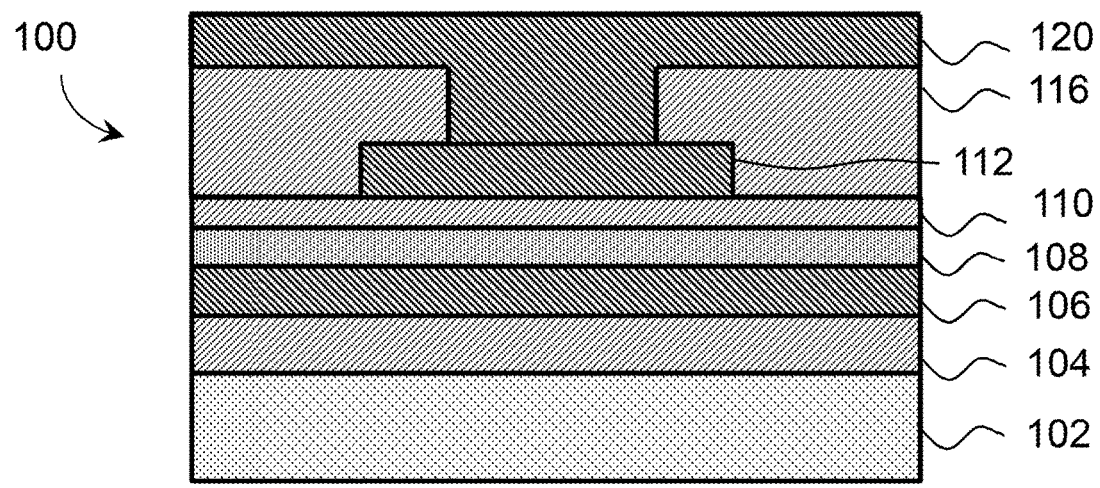

At 308, semiconductor fabrication equipment deposits a first superconducting wiring layer 120, that superconducts in a range of critical temperatures, over (e.g., on) at least part of the dielectric layer 116 and at least part of outer superconducting layer 112, as shown in FIG. 9. For example, the semiconductor fabrication equipment employs a CVD process to deposit the first superconducting wiring layer 120 on the dielectric layer 116 and within the voids (or holes) in the dielectric layer 116 defined by patterning. In one embodiment, the dielectric layer 116 is comprised of matching material to the inner superconducting layer 106 and outer superconductive layer 112. In one embodiment, semiconductor fabrication equipment planarizes the superconducting wiring layer 120 at 308. For example, the semiconductor fabrication equipment employs a CMP process to planarize the superconducting wiring layer 120. Such a process may be used on the wiring layers described herein.

At 310, the semiconductor fabrication equipment patterns the first superconducting wiring layer 120 following the process described herein for patterning the outer superconductive layer 112. In some embodiments, the patterning of the first superconducting wiring layer 120 follows the process of patterning the outer superconducting layer 112. The patterning can remove parts of the first superconducting wiring layer 120.

Figure 10:
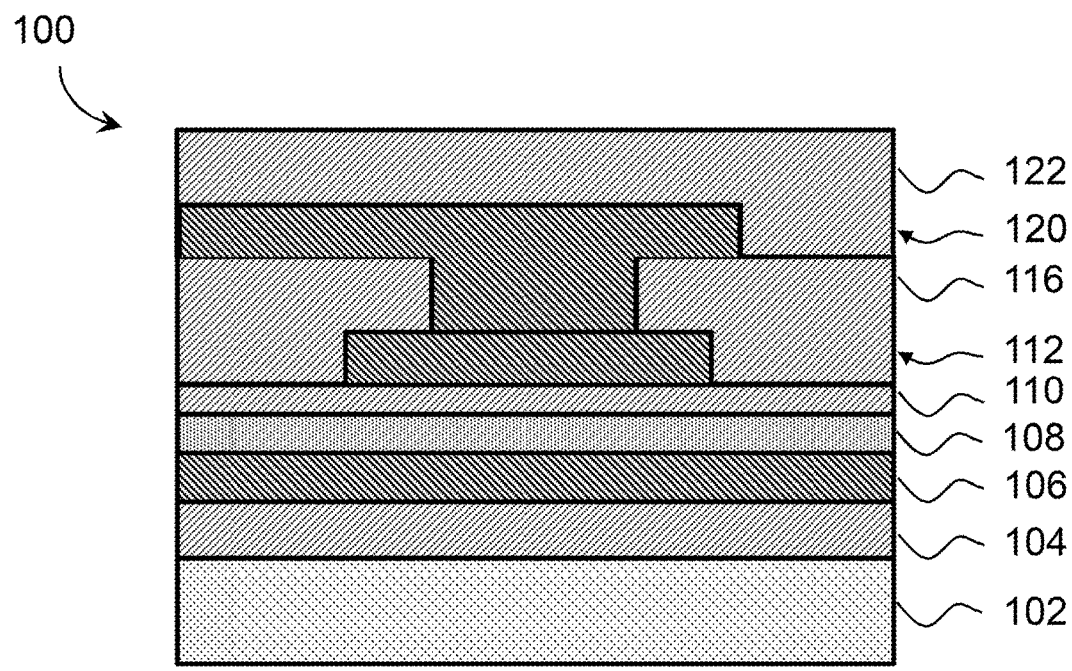

At 312, semiconductor fabrication equipment deposits a second dielectric layer 122 over (e.g., on) at least part of the first superconducting wiring layer 120 and at least part of the first dielectric layer 116. As shown in FIG. 10, the second dielectric layer 122 has been planarized, for example using processes discussed herein. At 314, the semiconductor fabrication equipment can pattern the dielectric layer 122. In one embodiment, semiconductor fabrication equipment planarizes the second dielectric layer 122 at 312. For example, the semiconductor fabrication equipment employs a CMP process to planarize the second dielectric layer 122. Such a process may be used on the dielectric layers described herein.

Figure 11:
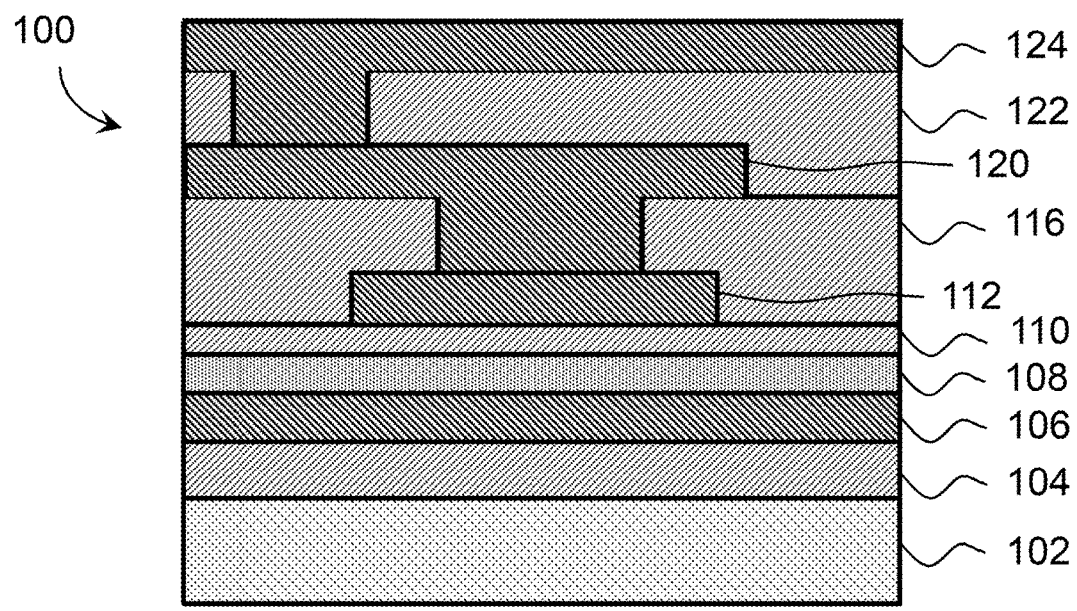
Figure 12:
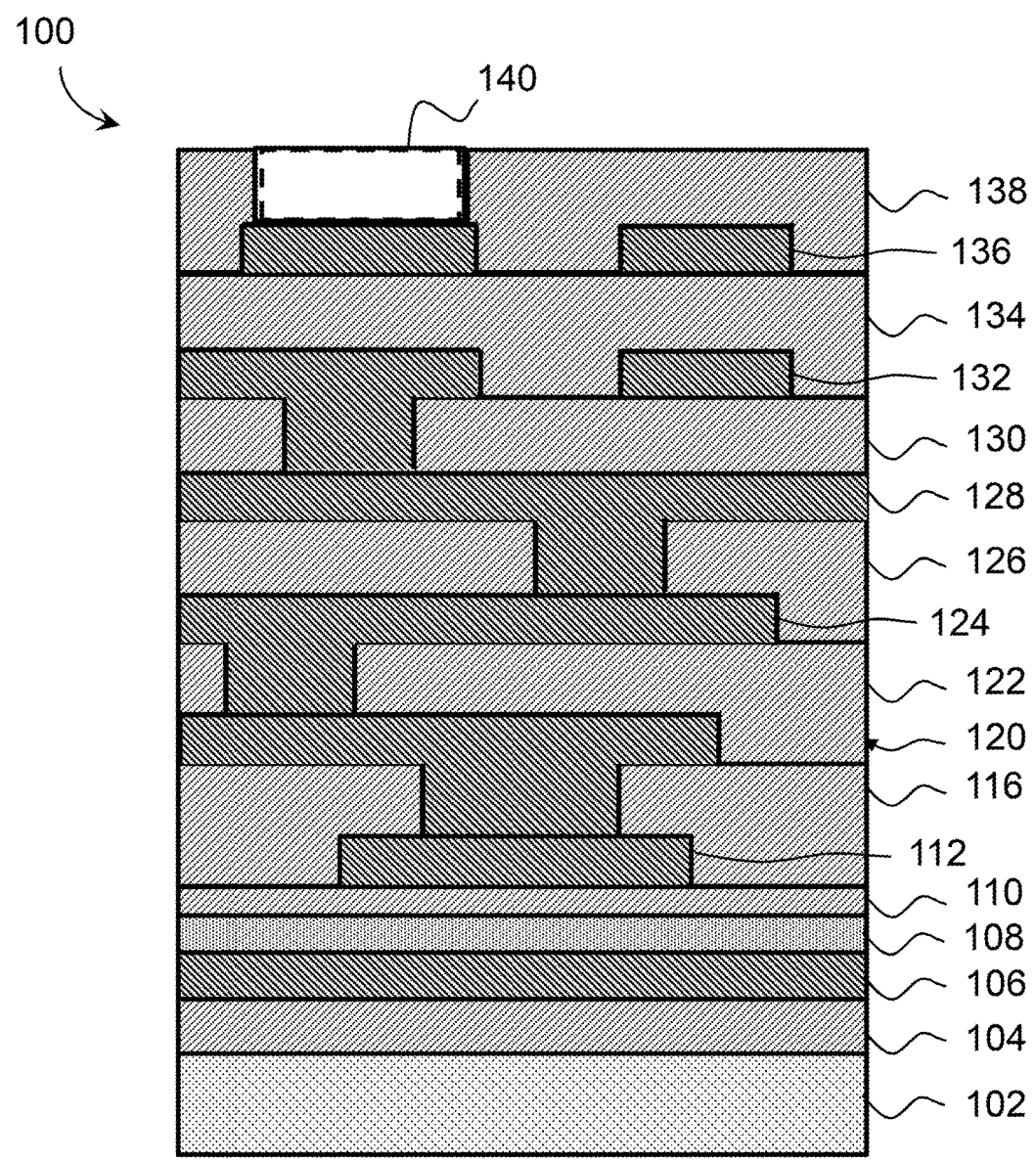

At 316, the semiconductor fabrication equipment can deposit and pattern one or more further superconducting wiring layers and associated dielectric layers disposed between the one or more further superconducting wiring layers. For example, a second superconducting wiring layer 124 can be added, patterned, planarized, and the like as shown in FIG. 11. The process can continue creating further superconducting wiring layers and associated dielectric layers. For example, superconducting wiring layers 128, and 132; and dielectric layers 126, 130, and 134, shown in FIG. 11.

At 318, the semiconductor fabrication equipment deposits and patterns a top superconducting wiring layer. For example, superconducting wiring layer 136 in FIG. 12 can be deposited in act 318.

At 320, the semiconductor fabrication equipment patterns the top superconducting layer. The patterning of the top superconducting layer may be implemented as described for other superconducting wiring layers (e.g., 120, 124, 128) and the outer superconducting layer 112.

At 322, semiconductor fabrication equipment deposits a top dielectric layer 138 over (e.g., on) at least part of the top superconducting wiring layer 136. In some embodiments, the dielectric is made from the same material and is of the same thickness as the dielectric layers between superconducting wiring layers. In some embodiments, the dielectric is silicon dioxide and is approximately 200 nanometers thick. In some embodiments, the silicon dioxide dielectric thickness is between approximately 150 and approximately 300 nanometers depending on the example. In some embodiments, the dielectric is silicon nitride and is approximately 100 nanometers thick. In some embodiments, the silicon nitride dielectric is between approximately 10 and approximately 80 nanometers thick depending on the example.

In some implementations the silicon dioxide is $SiO_a$ deposition. In such deposition the silicon dioxide is created using a Tetraethoxysilane-based (TEOS-based) Chemical Vapor Deposition (CVD) process. The TEOS is a precursor that is used to form silicon dioxide. In some implementations the silicon dioxide is $SiO_b$ deposition. In $SiO_b$ deposition High Density Plasma (HDP) based on silicane ($SiH_4$) gas is used to the silicon dioxide. In some implementations where the dielectric layer 138 is silicon nitride the dielectric is added by physical vapor deposition (PVD). Thus, phrases such as depositing an insulating layer or depositing an oxide, and variations of such (e.g., depositing a silicon oxide) mean that the material is deposited on another layer. This contrasts with forming or growing an insulating layer using a chemical reaction with a layer or substrate, for example by exposing a silicon layer or substrate to oxygen or some other material to form or grow the oxide layer.

At 324, semiconductor fabrication equipment may pattern the top dielectric layer 138. The process follows the patterning described for dielectric layer 116. The semiconductor fabrication equipment can pattern the dielectric layer 116. The semiconductor fabrication equipment deposits a photoresist and creates a mask. Semiconductor fabrication equipment etches away portions of the dielectric layer 138, removes the mask, and the like. This creates or defines one or more voids, e.g., void 140, within dielectric layer 138. The voids may be used to define contact pads to allow the integrated circuit to make electric contact with additional circuitry. In some examples, the contact pads are rectangular. In some examples, one side of the rectangular contact pad is approximately 30 micrometers to approximately 150 micrometers in length.

The above described fabrication techniques are applicable to building integrated superconducting circuits with low noise from magnetic sources. Such circuits are useful in building quantum devices. Low noise is a desirable characteristic of quantum devices. Experimental data showing the efficacy of the above described fabrication techniques is included below.

Quantum Devices

Quantum devices are structures in which quantum mechanical effects are observable. Quantum devices include circuits in which current transport is dominated by quantum mechanical effects. Such devices include spintronics, where electronic spin is used as a resource, and superconducting circuits. Both spin and superconductivity are quantum mechanical phenomena. Quantum devices can be used for measurement instruments, in computing machinery, and the like.

Quantum Computation

Quantum computation and quantum information processing are active areas of research and define classes of vendible products. A quantum computer is a system that makes direct use of quantum-mechanical phenomena, such as, superposition, tunneling, and entanglement, to perform operations on data. The elements of a quantum computer are not binary digits (bits) but typically are quantum binary digits or qubits. Quantum computers hold the promise of providing exponential speedup for certain classes of computation problems like simulating quantum physics. Useful speedup may exist for other classes of problems.

There are several types of quantum computers. An early proposal from Feynman in 1981 included creating artificial lattices of spins. More complicated proposals followed including a quantum circuit model where logical gates are applied to qubits in a time 2000, a ordered way. In model of computing was introduced for solving satisfiability problems; based on the adiabatic theorem this model is called adiabatic quantum computing. This model is believed useful for solving hard optimization problems and potentially other problems.

Adiabatic Quantum Computation

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is a linear interpolation between initial Hamiltonian and final Hamiltonian. An example is given by:

$$H_e = (1-s)H_i + sH_f \qquad (1)$$

where $H_i$ is the initial Hamiltonian, $H_f$ is the final Hamiltonian, $H_e$ is the evolution or instantaneous Hamiltonian, and s is an evolution coefficient which controls the rate of evolution. As the system evolves, the evolution coefficient s goes from 0 to 1 such that at the beginning (i.e., s=0) the evolution Hamiltonian $H_e$ is equal to the initial Hamiltonian $H_i$ and at the end (i.e., s=1) the evolution Hamiltonian $H_e$ is equal to the final Hamiltonian $H_f$. Before the evolution begins, the system is typically initialized in a ground state of the initial Hamiltonian $H_i$ and the goal is to evolve the system in such a way that the system ends up in a ground state of the final Hamiltonian $H_f$ at the end of the evolution. If the evolution is too fast, then the system can be excited to a higher energy state, such as the first excited state. In the present systems and devices, an "adiabatic" evolution is an evolution that satisfies the adiabatic condition:

$$\dot{s}|\langle 1|dH_e/ds|0\rangle| = \delta g^2(s) \qquad (2)$$

where $\dot{s}$ is the time derivative of s, g(s) is the difference in energy between the ground state and first excited state of the system (also referred to herein as the "gap size") as a function of s, and δ is a coefficient much less than 1. Generally the initial Hamiltonian $H_i$ and the final Hamiltonian $H_f$ do not commute. That is, $[H_i, H_f] \neq 0$.

The process of changing the Hamiltonian in adiabatic quantum computing may be referred to as evolution. The rate of change, for example, change of s, is slow enough that the system is always in the instantaneous ground state of the evolution Hamiltonian during the evolution, and transitions at anti-crossings (i.e., when the gap size is smallest) are avoided. The example of a linear evolution schedule is given above. Other evolution schedules are possible including non-linear, parametric, and the like. Further details on adiabatic quantum computing systems, methods, and apparatus are described in, for example, U.S. Pat. Nos. 7,135,701 and 7,418,283.

Quantum Annealing

Quantum annealing is a computation method that may be used to find a low-energy state, typically preferably the ground state, of a system. Similar in concept to classical annealing, the method relies on the underlying principle that natural systems tend towards lower energy states because lower energy states are more stable. However, while classical annealing uses classical thermal fluctuations to guide a system to a low-energy state and ideally its global energy minimum, quantum annealing may use quantum effects, such as quantum tunneling, to reach a global energy minimum more accurately and/or more quickly than classical annealing. In quantum annealing thermal effects and other noise may be present to aid the annealing. However, the final low-energy state may not be the global energy minimum. Adiabatic quantum computation, therefore, may be considered a special case of quantum annealing for which the system, ideally, begins and remains in its ground state throughout an adiabatic evolution. Thus, those of skill in the art will appreciate that quantum annealing systems and methods may generally be implemented on an adiabatic quantum computer. Throughout this specification and the appended claims, any reference to quantum annealing is intended to encompass adiabatic quantum computation unless the context requires otherwise.

Quantum annealing uses quantum mechanics as a source of disorder during the annealing process. The optimization problem is encoded in a Hamiltonian $H_P$, and the algorithm introduces quantum effects by adding a disordering Hamiltonian $H_D$ that does not commute with $H_P$. An example case is:

$$H_E \propto A(t)H_D + B(t)H_P \qquad (3)$$

where A(t) and B(t) are time dependent envelope functions. The Hamiltonian $H_E$ may be thought of as an evolution Hamiltonian similar to $H_e$ described in the context of adiabatic quantum computation above. The disorder may be removed by removing $H_D$ (i.e., reducing A(t)). The disorder may be added and then removed. Thus, quantum annealing is similar to adiabatic quantum computation in that the system starts with an initial Hamiltonian and evolves through an evolution Hamiltonian to a final "problem" Hamiltonian $H_P$ whose ground state encodes a solution to the problem. If the evolution is slow enough, the system will typically settle in the global minimum (i.e., the exact solution), or in a local minimum close in energy to the exact solution. The performance of the computation may be assessed using the residual energy (difference from exact solution using the objective function) versus evolution time. The computation time is the time required to generate a residual energy below some acceptable threshold value. In quantum annealing, $H_P$ may encode an optimization problem but the system does not necessarily stay in the ground state at all times. The energy landscape of $H_P$ may be crafted so that its global minimum is the answer to the problem to be solved, and low-lying local minima are good approximations.

Superconducting Qubits

There is a type of solid state qubit which is based on circuits of superconducting materials. Superconducting material conducts without electrical resistance under certain conditions like below a critical temperature, a critical current, or a magnetic field strength, or for some materials above a certain pressure. There are two superconducting effects that underlie how superconducting qubits operate: flux quantization, and Josephson tunneling.

Flux is quantized when a loop of superconducting material, threaded by a magnetic flux, is cooled below its superconducting critical temperature while the field is switched off. The supercurrent continues in an effort to maintain the flux. The flux is quantized. Thus, superconductivity is not simply the absence of electrical resistance but rather a quantum mechanical effect. All the current in the loop is governed by a single wavefunction and for the wavefunction to be single valued at any point in the loop the flux is quantized.

Josephson tunneling is where the current tunnels through a minor interruption in the loop, such as an insulating gap of a few nanometers. The amount of current is sinusoidally dependent on the phase difference across the interruption. This sinusoidally dependency is a non-linearity that leads to anharmonicity in the energy levels of the system.

These superconducting effects present in different configurations to give rise to different types of superconducting qubits including flux, phase, charge, and hybrid qubits. These different types of qubits depend on the topology of the loops and the physical parameters of the parts of the loops, such as, inductance, capacitance, and persistent current.

Quantum Processor

A quantum processor may take the form of a superconducting quantum processor. A superconducting quantum processor may include a number of qubits and associated local bias devices, for instance two or more superconducting qubits. A superconducting quantum processor may also employ coupling devices (i.e., "couplers") providing communicative coupling between qubits. A qubit and a coupler resemble each other but differ in physical parameters. One difference is the parameter, $\beta$. Consider an rf-SQUID, superconducting loop interrupted by a Josephson junction, $\beta$ is the ratio of the inductance of the Josephson junction to the geometrical inductance of the loop. A design with lower values of $\beta$, about 1, behaves more like a simple inductive loop, a monostable device. A design with higher values is dominated by the Josephson junctions, and is more likely to have bistable behavior. The parameter, $\beta$ is defined a $2\pi L I_C/\Phi_0$. That is, $\beta$ is proportional to the product of inductance and critical current. One can vary the inductance, for example, a qubit is normally larger than its associated coupler. The larger device has a larger inductance, and thus the qubit is often a bistable device and a coupler monostable. Alternatively the critical current can be varied, or the product of the critical current and inductance can be varied. A qubit often will have more devices associated with it. Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

The types of problems that may be solved by any particular embodiment of a quantum processor, as well as the relative size and complexity of such problems, typically depend on many factors. Two such factors may include the number of qubits in the quantum processor and the number of possible communicative connections (e.g., connectivity) between qubits in the quantum processor.

U.S. Pat. No. 8,421,053 describes a quantum processor with qubits laid out into an architecture of unit cells including bipartite graphs, such as, $K_{4,4}$. In such an example, each qubit may communicatively couple to at least four other qubits. Some qubits in the architecture may have a physical connectivity of six. Depending on the available number of qubits and their interaction, problems of various sizes may be embedded into the quantum processor.

Hamiltonian Description of a Quantum Processor

In accordance with some embodiments of the present systems and devices, a quantum processor may be designed to perform adiabatic quantum computation and/or quantum annealing. An evolution Hamiltonian is proportional to the sum of a first term proportional to the problem Hamiltonian and a second term proportional to the disordering Hamiltonian. As previously discussed, a typical evolution may be represented by Equation (4):

$$H_E \propto A(t)H_D + B(t)H_P \qquad (4)$$

where $H_P$ is the problem Hamiltonian, disordering Hamiltonian is $H_D$, $H_E$ is the evolution or instantaneous Hamiltonian, and A(t) and B(t) are examples of an evolution coefficient which controls the rate of evolution. In general, evolution coefficients vary from 0 to 1. In some embodiments, a time varying envelope function is placed on the problem Hamiltonian. A common disordering Hamiltonian is shown in Equation (5):

$$H_D \propto -\frac{1}{2}\sum_{i=1}^{N}\Delta_i \sigma_i^x \qquad (5)$$

where N represents the number of qubits, $\sigma_i^x$ is the Pauli x-matrix for the $i^{th}$ qubit and $\Delta_i$ is the single qubit tunnel splitting induced in the $i^{th}$ qubit. Here, the $\sigma_i^x$ terms are examples of "off-diagonal" terms. A common problem Hamiltonian includes first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N} h_i \sigma_i^z + \sum_{j>i}^{N} J_{ij}\sigma_i^z\sigma_j^z\right] \quad (6)$$

where N represents the number of qubits, $\sigma_i^z$ is the Pauli z-matrix for the $i^{th}$ qubit, $h_i$ and $J_{i,j}$ are dimensionless local fields for the qubits, and couplings between qubits, and $\varepsilon$ is some characteristic energy scale for $H_P$. Here, the $\sigma_i^z$ and $\sigma_i^z\sigma_j^z$ terms are examples of "diagonal" terms. The former is a single qubit term and the latter a two qubit term. Throughout this specification, the terms "problem Hamiltonian" and "final Hamiltonian" are used interchangeably. Hamiltonians such as $H_D$ and $H_P$ in Equations (5) and (6), respectively, may be physically realized in a variety of different ways. A particular example is realized by an implementation of superconducting qubits.

Noise in a Quantum Processor

The above described fabrication methods create useful integrated circuits with lower levels of pink noise. The problem Hamiltonian is an idealization of the processor, which is modified by things like unintended crosstalk, non-ideality in rf-SQUID based qubits, non-ideality in rf-SQUID based couplers, and inaccuracies in setting the flux bias ($h_i$) and coupling ($J_{ij}$) values. Such values are important to using such an integrated circuit as part of a quantum processor, measuring device, and the like.

Much of the static control error can be designed out of the system with careful layout and high-precision flux sources, as well as by adding circuitry to tune away any non-ideal flux qubit behavior. Pink noise adds a large contribution to the over control errors to implement Hamiltonians like for example, Equation 6. Consider, Equation (6) repeated here:

$$H_P \propto -\frac{\varepsilon}{2}\left[\sum_{i=1}^{N} h_i \sigma_i^z + \sum_{j>i}^{N} J_{ij}\sigma_i^z\sigma_j^z\right] \quad (6)$$

Errors in the terms of the Hamiltonian lead to a different problem being solved. Magnetic noise on the qubits interferes with properly annealing the quantum processor. Consider the single qubit terms. The connection between local bias and magnetic noise may be expressed as:

$$\delta h_j = 2|I_P|\delta\phi_q \quad (7)$$

where $I_P$ is the persistent current in the qubit loop, and $\phi_q$ is the external flux bias. Thus, changes in external flux are directly proportional to changes in the bias value for the qubit, $h_j$. The steep transition between the qubit states as the flux bias $\phi_q$ is swept means that the qubit is very sensitive to flux noise at its degeneracy point ($\phi_q$=0). Here the qubit states are denoted $|0\rangle$ and $|1\rangle$ or respectively $|\downarrow\rangle$ and $|\uparrow\rangle$. Similar magnetic noise can affect the specification of two qubit terms in the problem Hamiltonian.

Pink noise distorts the target Hamiltonian and can introduce errors into the computational result from quantum annealing. Finding and eliminating sources of pink noise may improve the performance of a quantum processor for quantum annealing and related operations.

In some embodiments, measuring noise is done by placing the qubit at degeneracy, annealing, and then reading out the resulting state. In some examples, measuring pink noise includes placing the qubit at degeneracy, annealing toward a problem Hamiltonian, and then reading out the resulting state. In some examples, the annealing is done by ramping the flux applied to the qubit from $\phi_0/2$ to $\phi_0$. The annealing duration may, for example, be approximately 10 microseconds. The state of qubit is recorded. In some embodiments, is possible to perform this process on several qubits at once. In some examples, the problem Hamiltonian is selected such that the final state of one or more qubits favors neither basis state. In the absence of flux noise, also called magnetic noise, this measurement should consistently give the probability of being in each qubit state as equal, that is $P_{|0\rangle} = P_{|1\rangle} = 0.5$, for a sufficiently large sample size. In the presence of noise, a time varying bias is expected and observed.

When the qubit is in thermal equilibrium with a thermal bath at temperature T, and the noise ($\phi_n(t)$) has a low frequency characteristic then the probability of finding the qubit in the $|1\rangle$ state is given:

$$P_{|1\rangle} = \frac{1}{2}\left[1 + \tanh\left(\frac{\phi_n(t) + \phi_q^x - \phi_q^0}{\left(\frac{k_bT}{I_P^*}\right)}\right)\right] \quad (8)$$

Where $I_P^*$ is the persistent current of the qubit at the point where dynamics cease and the qubit localizes, $\phi_q^0$ is the degeneracy point of the qubit states, and $\phi_q^x$ is the flux applied to the qubit.

In the testing, the degeneracy point and the freeze out point are determined for each qubit. The system then performs a measurement of the probability of being in one state. Herein, without loss of generality, the state $|1\rangle$ and associated probability $P_{|1\rangle}$ are used. This is done by initializing the qubit at the degeneracy point and annealing toward the final Hamiltonian. In some embodiments, the problem Hamiltonian has zero local bias on the qubits. A readout is then made. By convention, whenever the outcome is $|\uparrow\rangle$ the result is 1, and when the outcome is $|\downarrow\rangle$ the result is 0. After a first number, n, of cycles including initialize, anneal, readout, and record acts a probability is recorded. The probability is proportional the summation of the outcomes normalized by the number of cycles. This probability is then used to recovering the flux noise on the qubit $\phi_n(t)$ be inverting Equation (8). This process repeated a second number, m, of cycles such that data is collected over long time scales. Each cycle may, for example, take approximately 35 microseconds. This gives a time varying measurement of the probability. Looking at a spectral transform, e.g., Fast Fourier Transform, of the data the noise for the qubit can be extracted.

The resulting probability data is converted to flux, and the power spectral density is fit to the model $$\frac{A^2}{f^\alpha} + w_n \quad (9)$$

where A is the noise amplitude, $\alpha$ is the "slope" a line fitted to the pink noise in a linear-log plot, and $w_n$ is the white noise background. The white noise background is a statistical measurement floor that can depend on sampling time and device temperature. Typical noise levels can include:

$A = 4-5\mu\phi_0/\sqrt{Hz}, \alpha = 0.7$, and $w_n = 2\mu\phi_0/\sqrt{Hz}$.

The unit $\mu\phi_0/\sqrt{Hz}$ is defined herein to be a Standard Noise Unit (SNU). However, chips built from conventional processes, such as those not including a passivation layer over the top superconducting wiring layer, have higher noise levels.

Impurities may be deposited on the metal surface and/or may arise from an interaction with the etch/photoresist chemistry and the metal. The pink noise can be caused by impurities on the upper surface of the quantum processor. The couplers are fabricated in the last wiring layer, and are thus sensitive to post-fabrication handling. Impurities on the upper surface of the quantum processor may, for example, result from the use of photoresist as a protective coating and/or impurities left on the surface from dicing a wafer into many chips. The hypothesis is that the effect of these impurities can be minimized with a barrier passivation layer such as a passivation layer deposited as described above.

The impurities were assumed to be spin-½ particles. Modelling of the processor including the Josephson multi-layer, superconducting wiring layers, and associated dielectric layers supported the hypothesis. A test was devised to test an integrated circuit formed without using a passivation of the top superconducting wiring layer against an integrated circuit using a passivation layer of the top superconducting wiring layer. An example of a passivation layer is layer 138 in FIG. 12.

This test was derived from knowledge that qubit couplers, devices that implement two qubit terms of the problem Hamiltonian, are largely formed in the top wiring layer. The body of the coupler resides mostly in the top wiring layer but does include a portion of its current path in vias, lower wiring layers, and the Josephson multi-layer. For example, a layout of one quantum processor has about 90% of the coupler body in the top wiring layer. Thus the test assumes these couplers which are closest to the impurities on the surface of the integrated surface would sense the presence of the impurities more than couplers that were spaced farther from the impurities. As qubits are artificial spin-½ particles, it was determined that for certain coupler values, these couplers would contribute different amounts of noise. This is convenient to implement since many couplers are associated with one qubit, and readout apparatus has been designed for qubit measurement. The hypothesis was confirmed.

Figure 15:
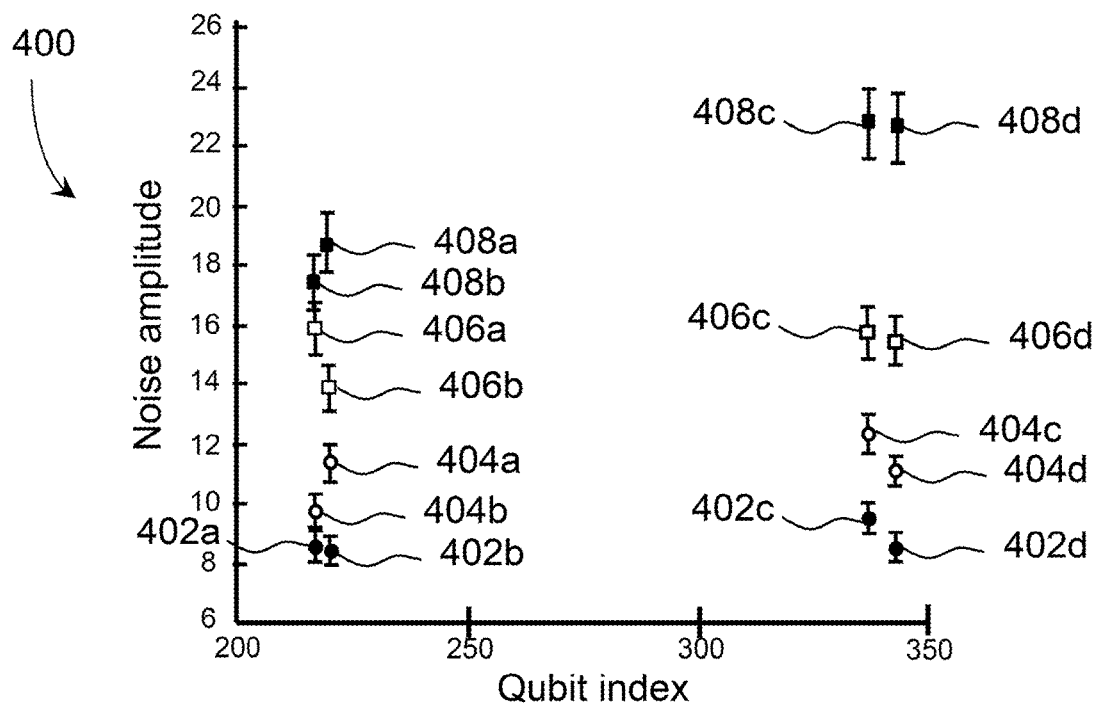
FIG. 15 is a graph which plots noise levels in a series of qubit constructed without using a passivation of the top superconducting wiring layer, in accordance with the present systems and methods.

FIG. 15 is a graph which plots noise levels in a series of qubits constructed without using a passivation of the top superconducting wiring layer, in accordance with the present systems and methods. Data in graph 400 is extracted using the noise measurement process described above and is mostly pink noise. The graph 400 shows the noise for 4 qubits plotted against qubit index. The plot is arranged in four series. The first series 402a, 402b, 402c, and 402d corresponds to the couplers attached to the qubits being set to J=1. In the convention used, this is antiferromagnetic. The second series 404a, 404b, 404c, and 404d is data when the couplers attached to the qubits is set to J=0 or no coupling value. The noise amplitude in second series 404a, 404b, 404c, and 404d is higher than in first series 402a, 402b, 402c, and 402d. A third series 406a, 406b, 406c, and 406d is shown. Data in series 406a, 406b, 406c, and 406d is for couplers with coupling value J=−1. In the convention used, this is ferromagnetic. A fourth series 408a, 408b, 408c, and 408d is shown. Data in series 408a, 408b, 408c, and 408d is for couplers with coupling value J=−2. In the convention used, this is strongly ferromagnetic. The noise in qubits varies from about 8 to about 19 SNU. The setting in the coupler affects the noise seen by the qubit. The amount of noise found even in the data series 402a, 402b, 402c, and 402d is higher than desirable.

Figure 16:
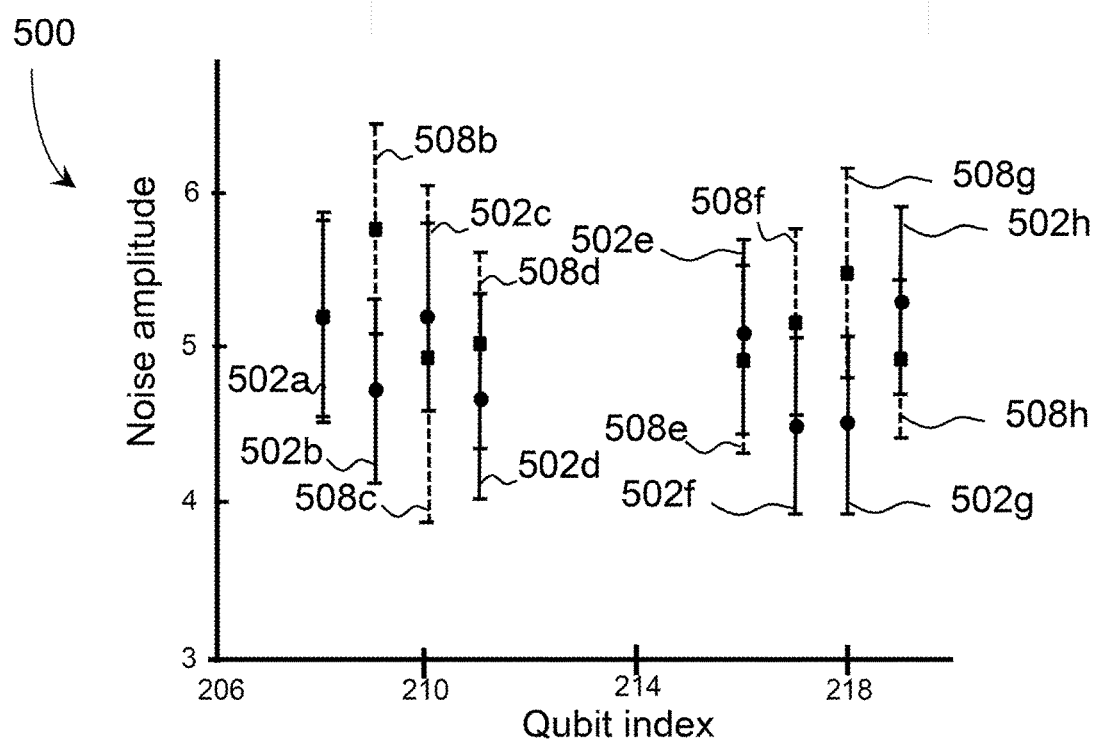
FIG. 16 is a graph which plots noise levels in a series of qubit constructed using a passivation of the top superconducting wiring layer, in accordance with the present systems and methods.
Figure 17A:
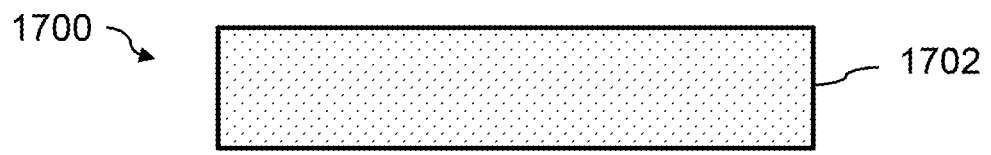
FIGS. 17A through 17E are each respective cross-sectional representations of a superconducting integrated circuit at sequential phases of a fabrication process, according to one illustrated embodiment.
Figure 17B:
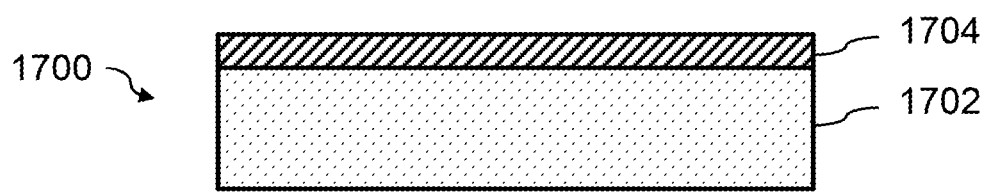
Figure 17C:
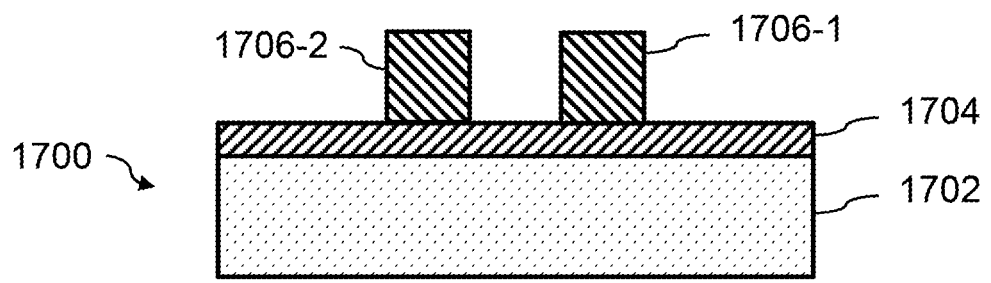
Figure 17D:
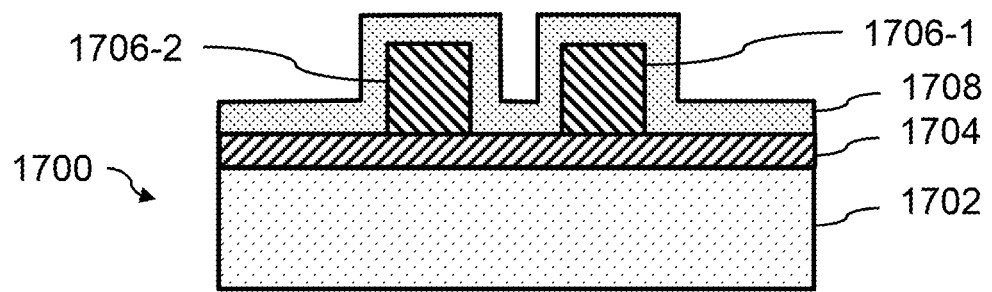
Figure 17E:
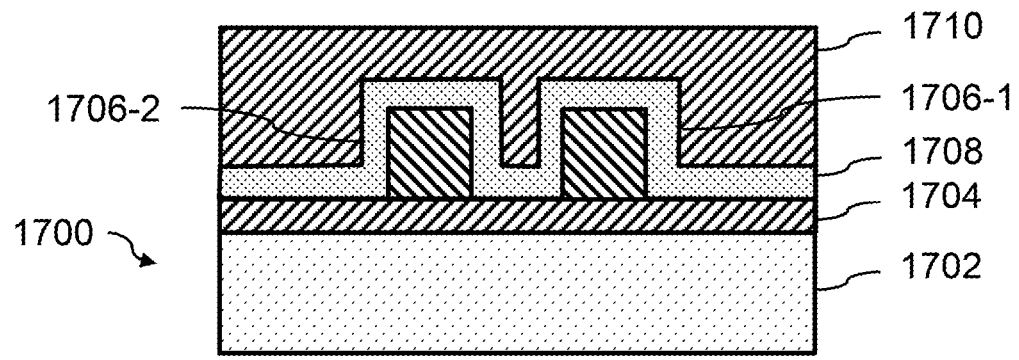

FIG. 16 is a graph which plots noise levels in a series of qubit constructed using a passivation of the top superconducting wiring layer, in accordance with the present systems and methods. An example of a passivation layer is layer 138 in FIG. 12. The graph 500 shows the noise for 8 qubits plotted against qubit index. The plot is arranged in two series. The first series 502a through 502h is data when the couplers attached to the qubits is set to J=1. In the convention used, this is antiferromagnetic. A second series 508a through 508h is shown. Data in series 508a through 508h is for couplers with coupling value J=−1. In the convention used, this is strongly ferromagnetic.

The data in the first series 502a through 502h overlaps with the data in second series 508a through 508h. The noise in qubits varies from about 4 to about 6 SNU. The error bars for the first and second data series overlap. Data for no coupling and ferromagnetic cases was taken but not plotted since the extra points and error bars reduced clarity of graph 500. Thus, the noise seen by the qubit is unaffected by coupler.

FIGS. 15 and 16 illustrate that couplers can transmit flux noise into qubits and demonstrate that fabrication methods change the pink noise observed in resulting integrated circuits. The processes described in FIGS. 1 through 14 and, in particular, FIGS. 8 through 12 and FIG. 14, provide an integrated circuit with lower noise.

In at least some aspects, the present application relates to enclosing of superconducting wiring with passivation protection. In some implementations, the passivating layer can be an insulating layer, as described above. In other implementations, the passivating layer can be non-insulating, for example, the passivating layer can be a superconducting metal such as aluminum.

Passivation by the methods described herein can apply to the topmost layer of superconducting wiring and can apply to one or more inner layers of superconducting wiring. If there is more than one layer of superconducting wiring, the topmost (i.e., top) layer of superconducting wiring is the one that is spaced (i.e., positioned) relatively outward of the two or more superconducting wiring layers with respect to the substrate. The inner layers of superconducting wiring are layers that are spaced relatively inward of the top superconducting wiring layer with respect to the substrate.

One benefit of the methods described here is the protection of superconducting wiring from subsequent processing by semiconductor fabrication equipment.

Hybrid Dielectric System

In some implementations, any of the dielectric layers, insulating layers and passivation layers described above in reference to the present systems and methods related to the fabrication of superconducting circuits, are formed using a hybrid dielectric system. In some implementations, a higher-quality dielectric film, e.g., silicon nitride, is deposited after metal patterning to surround, or cap, the metal features. A more conventional (lower-quality) dielectric film, e.g., silicon dioxide, is deposited on at least one of the metal features, followed by chemical mechanical polishing (CMP) to a desired thickness. The use of hybrid dielectric material provides both a higher-quality dielectric surrounding the metal features and a conventional dielectric to allow the use of CMP for planarization. In some implementations, the higher-quality dielectric can be used to protect the sides of a superconducting metal feature.

FIGS. 17A through 17E are each respective cross-sectional representations of a superconducting integrated circuit at sequential phases of a fabrication process, according to one illustrated embodiment.

Figure 18:
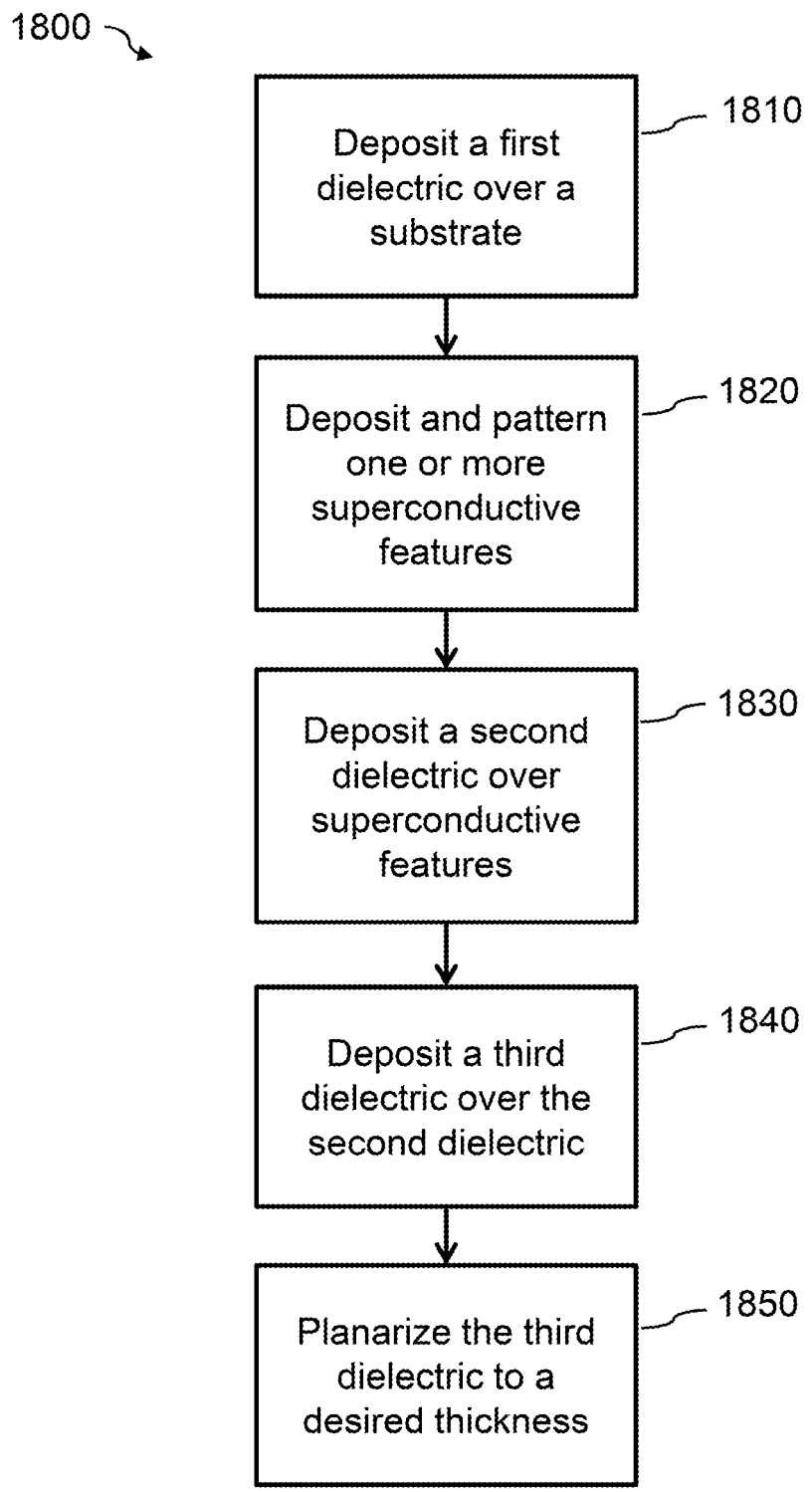
FIG. 18 is a flow diagram showing a fabrication method to produce the structures illustrated in FIGS. 17A through 17E, according to one illustrated embodiment.
Figure 19A:
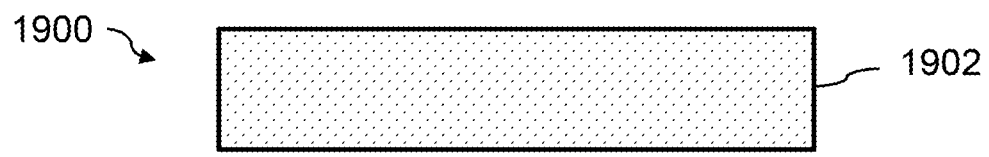
FIGS. 19A to 19F are each respective cross-sectional representations of a superconducting integrated circuit at sequential phases of a fabrication process, according to one illustrated embodiment.
Figure 19B:
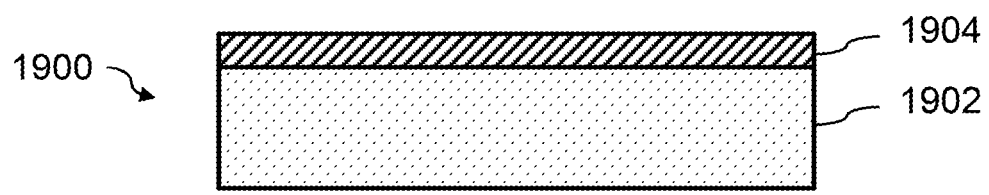
Figure 19C:
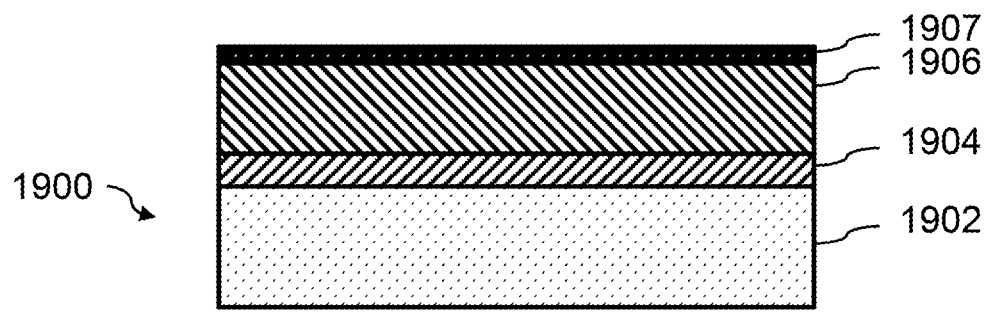
Figure 19D:
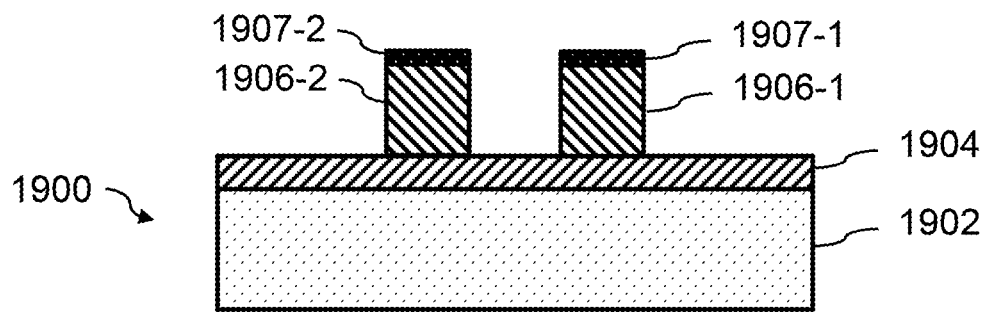
Figure 19E:
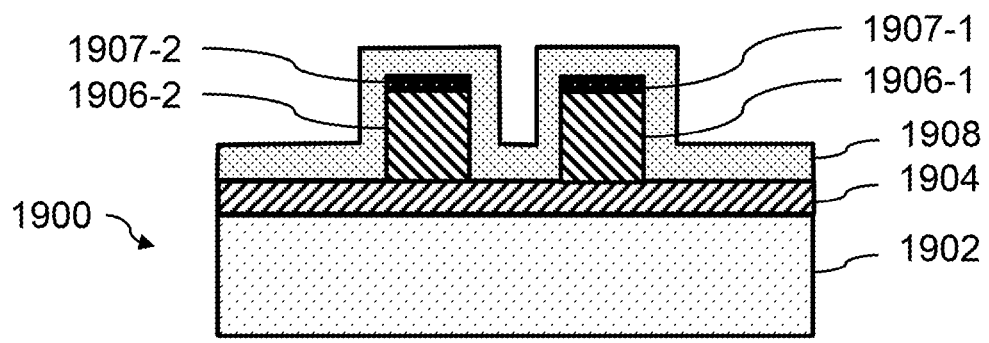
Figure 19F:
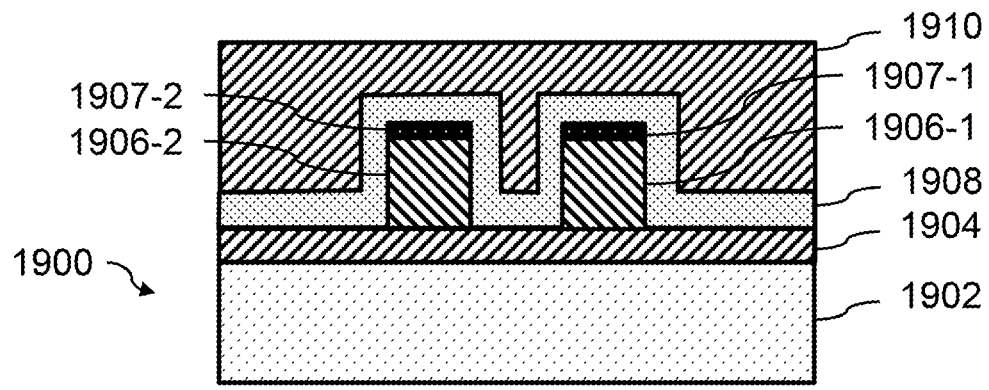

FIG. 18 is a flow diagram showing a fabrication method 1800 to produce the structures illustrated in FIGS. 17A through 17E, according to one illustrated embodiment.

Referring now to FIGS. 17A through 17E and FIG. 18, semiconductor fabrication equipment deposits a first dielectric layer 1704 over (e.g., on) at least part of a substrate 1702 at 1810. For example, the semiconductor fabrication equipment employs a CVD process to deposit the first dielectric layer 1704 on the substrate 1702. In one implementation, the substrate 1702 comprises silicon and the first dielectric layer 1704 comprises silicon dioxide. In one embodiment, semiconductor fabrication equipment planarizes the first dielectric layer 1704 at 1810. For example, the semiconductor fabrication equipment employs a CMP process to planarize the first dielectric layer 1704.

If the substrate 1702 is formed from a non-conductive material (e.g., sapphire), it may not be desirable to form the first dielectric layer 1704 at 1810. Accordingly, in at least one implementation, the act described above in connection with 1810 is not performed.

At 1820, semiconductor fabrication equipment deposits a superconductive layer and patterns the layer to form one or more features such as 1706-1 and 1706-2. For example, the semiconductor fabrication equipment deposits and patterns the superconductive layer as described with reference to FIGS. 1 and 2 above. The superconductive features 1706-1 and 1706-2 may, for example, each comprise niobium.

At 1830, semiconductor fabrication equipment deposits a second dielectric layer 1708 over at least one of superconductive features 1706-1 and 1706-2. In one implementation, the second dielectric layer 1708 surrounds and caps at least one of superconductive features 1706-1 and 1706-2. In one implementation, the second dielectric layer 1708 comprises a higher quality dielectric than the first dielectric layer 1704. In one implementation, the second dielectric layer comprises silicon nitride.

At 1840, semiconductor fabrication equipment deposits a third dielectric layer 1710 over at least part of the second dielectric layer 1708. In one implementation, the third dielectric layer 1710 comprises the same dielectric material as the first dielectric layer 1704. In one implementation, the third dielectric layer 1710 comprises silicon dioxide.

At 1850, semiconductor fabrication equipment planarizes the third dielectric layer 1710. For example, the semiconductor fabrication equipment employs a CMP process to planarize the third dielectric layer 1710.

It may not be desirable to planarize the third dielectric layer 1710 at 1850. Accordingly, in at least one implementation, the acts described above in connection with 1850 are not performed.

Another implementation deposits a high-quality dielectric film on top of the metal film prior to its patterning. The high-quality dielectric film caps the top surface of the metal from exposure to various process chemistries. After the high-quality dielectric film and the metal film are patterned, a second high-quality dielectric film is deposited on the capped metal features to surround the top and sides of the capped metal features. Conventional dielectric film can then be deposited and CMP polished to a desired thickness.

FIGS. 19A to 19F are each respective cross-sectional representations of a superconducting integrated circuit at sequential phases of a fabrication process, according to one illustrated embodiment.

Figure 20:
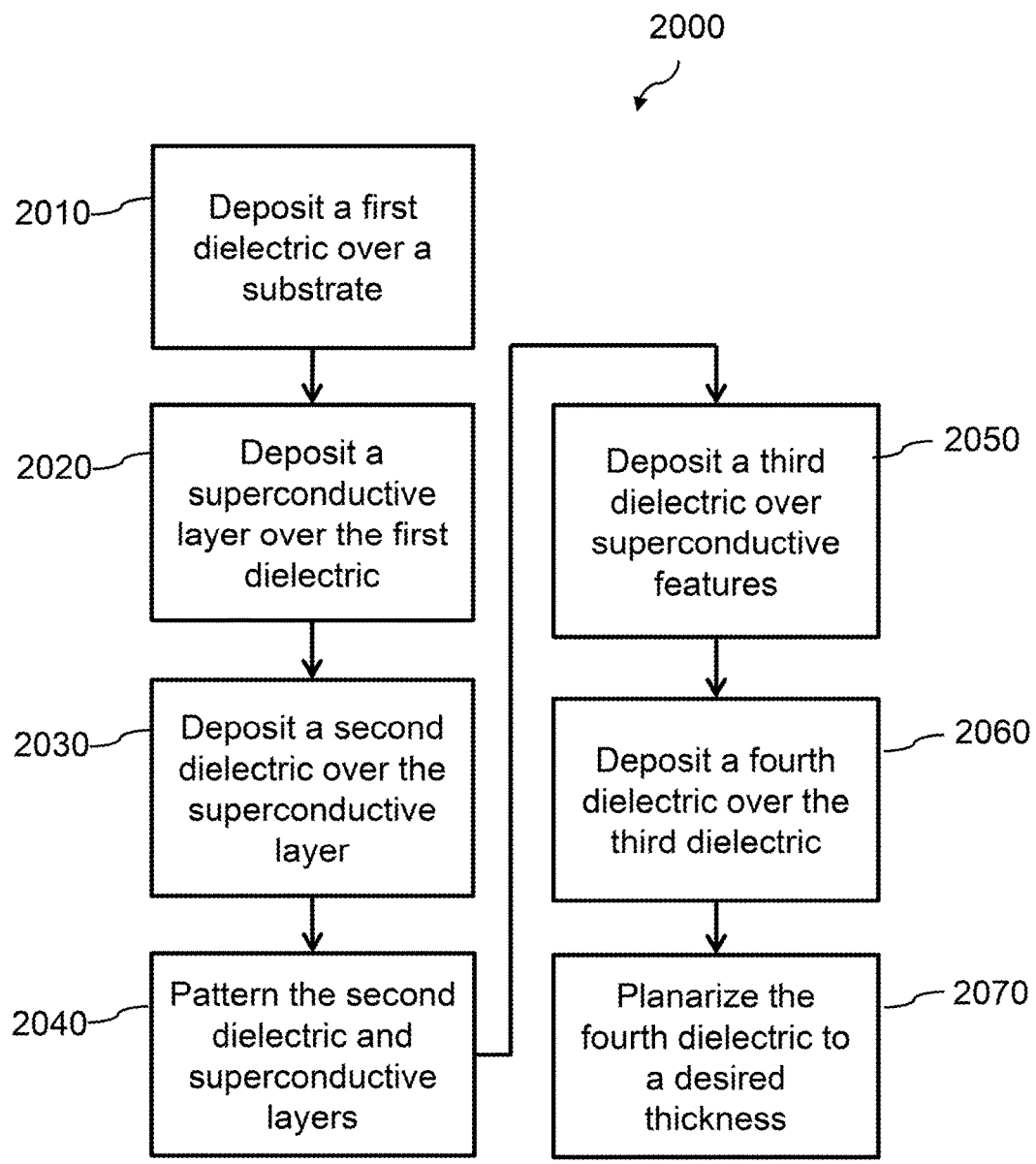
FIG. 20 is a flow diagram showing a fabrication method to produce the structures illustrated in FIGS. 19A through 19F, according to one illustrated embodiment.
Figure 21A:
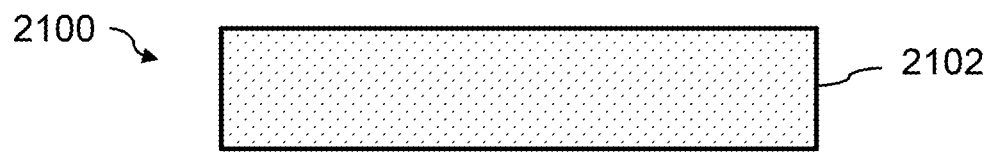
FIGS. 21A to 21H are each respective cross-sectional representations of a superconducting integrated circuit at sequential phases of a fabrication process, according to one illustrated embodiment.
Figure 21B:
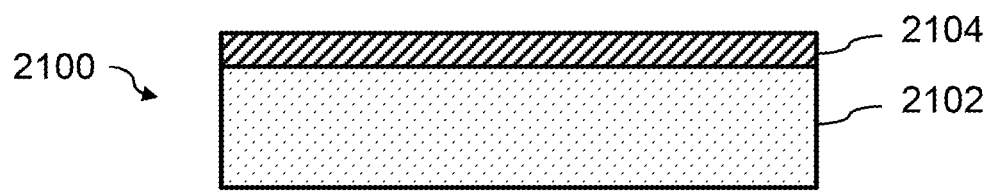
Figure 21C:
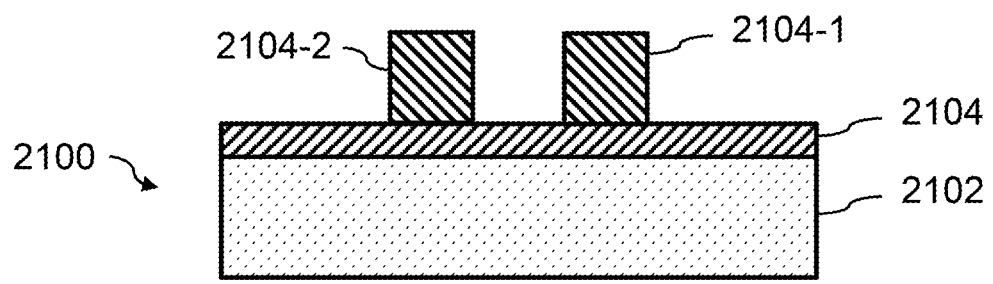
Figure 21D:
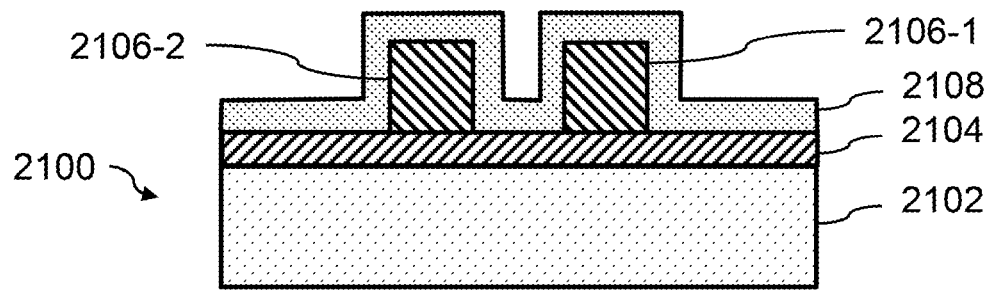
Figure 21E:
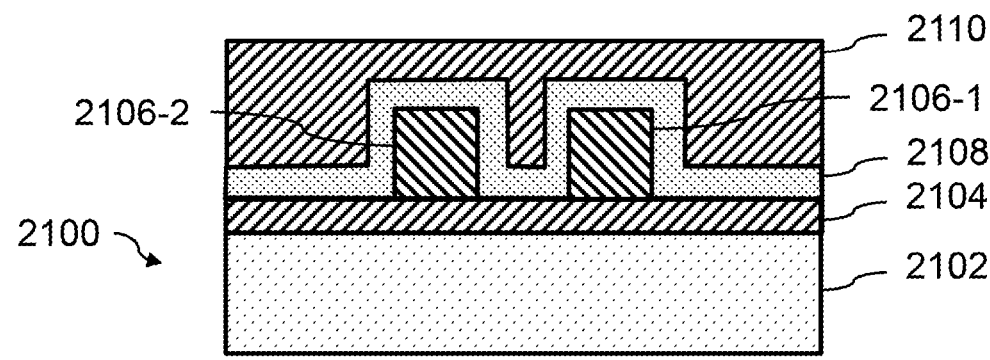
Figure 21F:
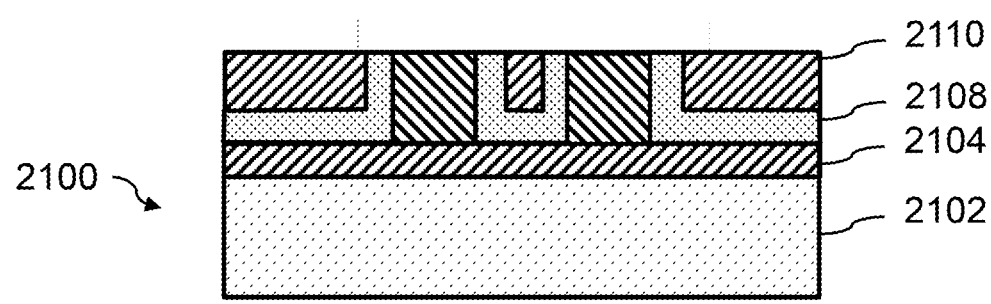
Figure 21G:
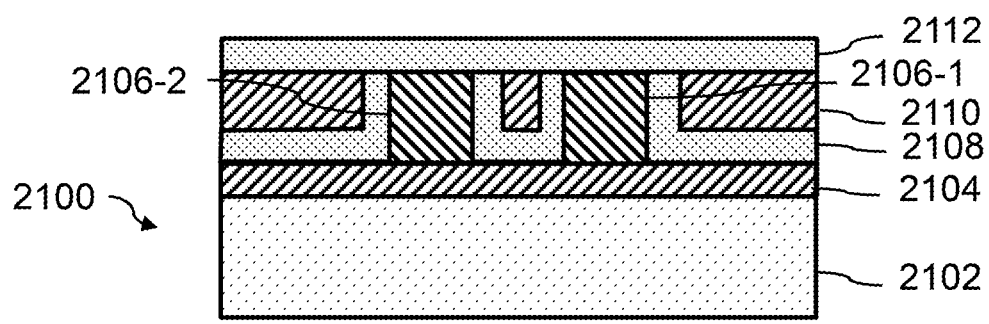
Figure 21H:
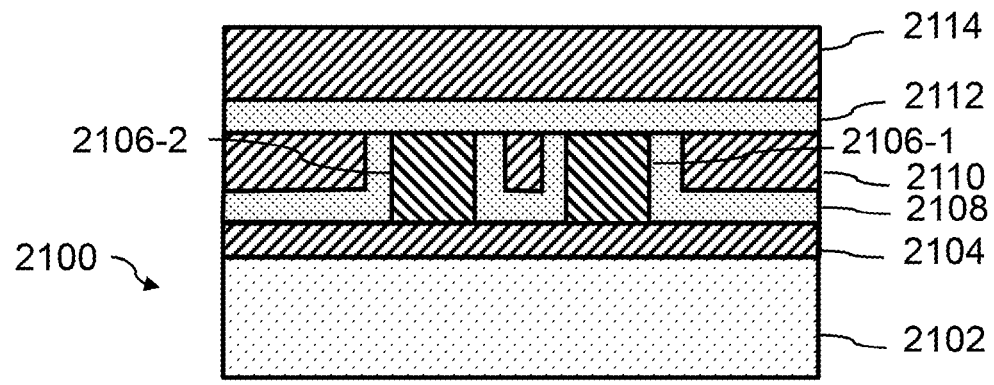

FIG. 20 is a flow diagram showing a fabrication method 2000 to produce the structures illustrated in FIGS. 19A through 19F, according to one illustrated embodiment.

Referring now to FIGS. 19A through 19F and FIG. 20, semiconductor fabrication equipment deposits a first dielectric layer 1904 over (e.g., on) at least part of a substrate 1902 at 2010. For example, the semiconductor fabrication equipment employs a CVD process to deposit the first dielectric layer 1904 on the substrate 1902. In one implementation, the substrate 1902 comprises silicon and the first dielectric layer 1904 comprises silicon dioxide. In one implementation, semiconductor fabrication equipment planarizes the first dielectric layer 1904 at 2010. For example, the semiconductor fabrication equipment employs a CMP process to planarize the first dielectric layer 1904.

If the substrate 1902 is formed from a non-conductive material (e.g., sapphire), it may not be desirable to form the first dielectric layer 1904 at 2010. Accordingly, in at least one implementation, the acts described above in connection with 2010 are not performed.

At 2020, semiconductor fabrication equipment deposits a superconductive layer 1906, and a second dielectric layer 1907 at 2030. In one implementation, the superconductive layer 1906 comprises niobium. In one implementation, the second dielectric layer 1907 comprises a higher quality dielectric than the first dielectric layer 1904. In one implementation, the second dielectric layer comprises silicon nitride.

At 2040, semiconductor fabrication equipment patterns the two layers—superconductive layer 1906 and second dielectric layer 1907—to form one or more features such as features comprising elements 1906-1 and 1907-1, and elements 1906-2 and 1907-2. For example, the semiconductor fabrication equipment deposits and patterns the superconductive layer and the second dielectric layer as described with reference to FIGS. 1 and 2 above. At 2050, semiconductor fabrication equipment deposits a third dielectric layer 1908 over at least one of the superconductive features, such as features comprising elements 1906-1 and 1907-1, and elements 1906-2 and 1907-2. In one embodiment, the third dielectric layer 1908 surrounds and caps at least one of the superconductive features. In one implementation, the third dielectric layer 1908 comprises a higher quality dielectric than the first dielectric layer 1904. In one implementation, the third dielectric layer comprises silicon nitride.

At 2060, semiconductor fabrication equipment deposits a fourth dielectric layer 1910 over at least part of the third dielectric layer 1908. In one embodiment, the fourth dielectric layer 1910 comprises the same dielectric material as the first dielectric layer 1904. In one embodiment, the fourth dielectric layer 1910 comprises silicon dioxide.

At 2070, semiconductor fabrication equipment planarizes the fourth dielectric layer 1910. For example, the semiconductor fabrication equipment employs a CMP process to planarize the third dielectric layer 1910.

It may not be desirable to planarize the third dielectric layer 1910 at 2070. Accordingly, in at least one implementation, the acts described above in connection with 2070 are not performed.

Another implementation may include the depositing of a high-quality dielectric after the patterning of the metal features, followed by the deposition of a conventional dielectric film. CMP is then used to polish the dielectric films down to the metal top surface. Another high-quality dielectric film is then deposited to form an inter-layer dielectric. Additional dielectric material can be deposited to form a hybrid inter-layer dielectric of a desired thickness.

FIGS. 21A to 21H are each respective cross-sectional representations of a superconducting integrated circuit at sequential phases of a fabrication process, according to one illustrated embodiment.

Figure 22:
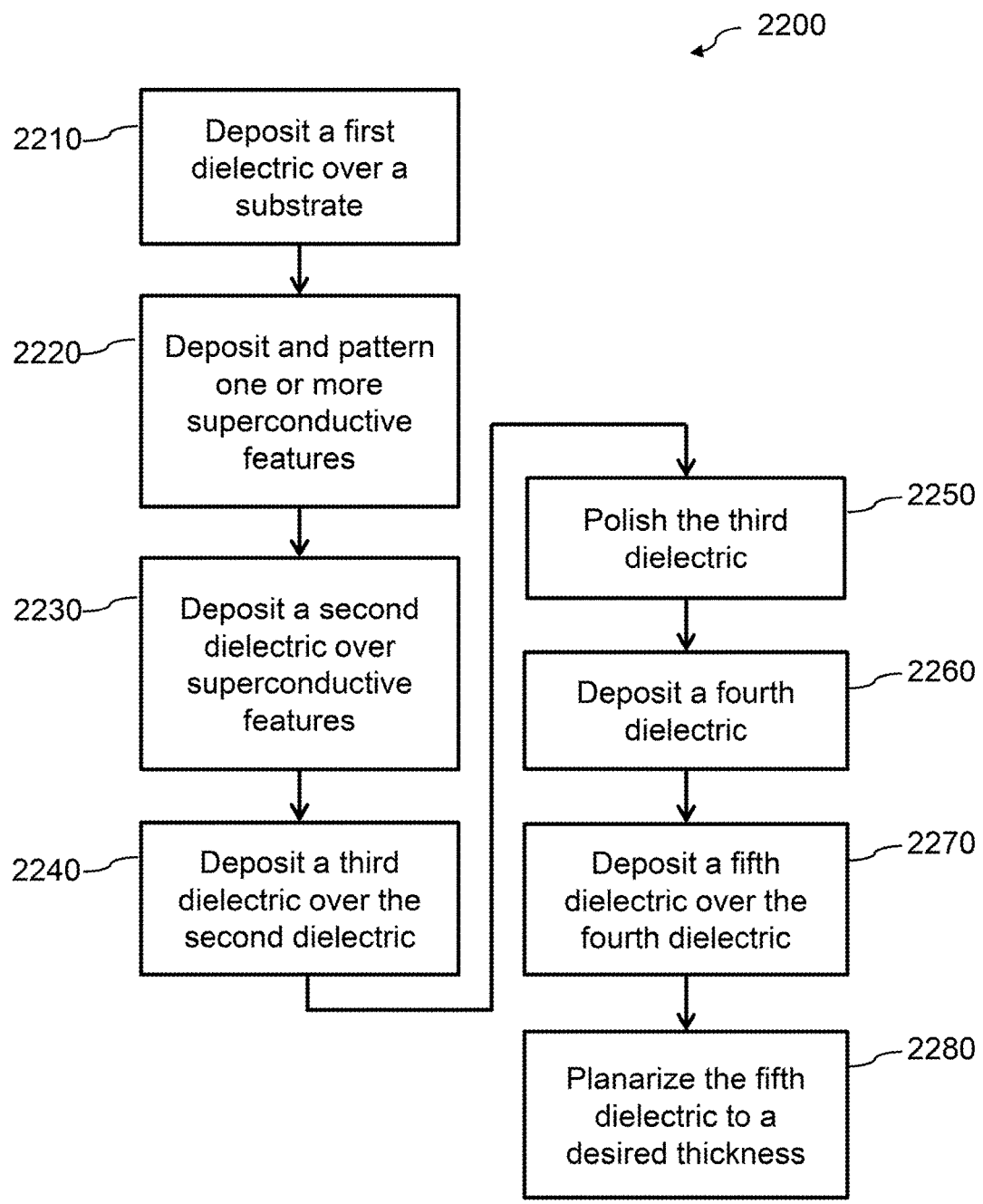
FIG. 22 is a flow diagram showing a fabrication method to produce the structures illustrated in FIGS. 21A through 21H, according to one illustrated embodiment.

FIG. 22 is a flow diagram showing a fabrication method 2200 to produce the structures illustrated in FIGS. 21A through 21E, according to one illustrated embodiment.

Referring now to FIGS. 21A through 21H and FIG. 22, semiconductor fabrication equipment deposits a first dielectric layer 2104 over (e.g., on) at least part of a substrate 2102 at 2210. For example, the semiconductor fabrication equipment employs a CVD process to deposit the first dielectric layer 2104 on the substrate 2102. In one implementation, the substrate 2102 comprises silicon and the first dielectric layer 2104 comprises silicon dioxide. In one implementation, semiconductor fabrication equipment planarizes the first dielectric layer 2104 at 2210. For example, the semiconductor fabrication equipment employs a CMP process to planarize the first dielectric layer 2104.

If the substrate 2102 is formed from a non-conductive material (e.g., sapphire), it may not be desirable to form the first dielectric layer 2104 at 2210. Accordingly, in at least one implementation, the acts described above in connection with 2210 are not performed.

At 2220, semiconductor fabrication equipment deposits a superconductive layer and patterns the layer to form one or more features such as 2106-1 and 2106-2. For example, the semiconductor fabrication equipment deposits and patterns the superconductive layer as described with reference to FIGS. 1 and 2 above. The superconductive features 2106-1 and 2106-2 may each comprise niobium.

At 2230, semiconductor fabrication equipment deposits a second dielectric layer 2108 over at least one of superconductive features 2106-1 and 2106-2. In one implementation, the second dielectric layer 2108 surrounds and caps at least one of superconductive features 2106-1 and 2106-2. In one implementation, the second dielectric layer 2108 comprises a higher quality dielectric than the first dielectric layer 2104. In one implementation, the second dielectric layer comprises silicon nitride.

At 2240, semiconductor fabrication equipment deposits a third dielectric layer 2110 over at least part of the second dielectric layer 2108. In one implementation, the third dielectric layer 2110 comprises the same dielectric material as the first dielectric layer 2104. In one implementation, the third dielectric layer 2110 comprises silicon dioxide.

At 2250, semiconductor fabrication equipment polishes the third dielectric layer 2110 down to the top surface of at least one of the superconductive features 2106-1 and 2106-2. For example, the semiconductor fabrication equipment employs a CMP process to polish the third dielectric layer 2110.

At 2260, semiconductor fabrication equipment deposits a fourth dielectric layer 2112 over at least one of the superconductive features 2106-1 and 2106-2, and over at least part of the third dielectric layer 2110.

At 2270, semiconductor fabrication equipment deposits a fifth dielectric layer 2114 over at least part of the fourth dielectric layer 2112. In one embodiment, the fifth dielectric layer 2114 comprises the same dielectric material as the first dielectric layer 2104. In one implementation, the fifth dielectric layer 2110 comprises silicon dioxide.

At 2280, semiconductor fabrication equipment planarizes the fifth dielectric layer 2114. For example, the semiconductor fabrication equipment employs a CMP process to planarize the fifth dielectric layer 2114.

It may not be desirable to planarize the third dielectric layer 2114 at 2280. Accordingly, in at least one implementation, the acts described above in connection with 2280 are not performed.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to the following U.S. Provisional Patent Applications: 62/036,969, filed Aug. 13, 2014; 62/120,723, filed Feb. 25, 2015; 61/979,406, filed Apr. 14, 2014; 61/987,782, filed May 2, 2014; 61/940,278, filed Feb. 14, 2014; 61/714,642, filed Oct. 16, 2012; 61/608,379, filed Mar. 8, 2012; and 61/156,377, filed Feb. 27, 2009; the following U.S. patent application Ser. No. 12/992,049, with 371 (c) date Nov. 10, 2010, Ser. No. 14/600,962, filed Jan. 20, 2015; and the following WO Patent Application Publication No. WO2013180780 A3, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacture, comprising:
    a quantum annealer comprising a superconducting integrated circuit, the superconducting integrated circuit comprising a plurality of superconducting flux qubits, and one or more coupling devices, each of the one or more coupling devices providing a respective communicative coupling between qubits of the plurality of qubits, the superconducting integrated circuit comprising:
    a substrate;
    a Josephson junction multi-layer overlying the substrate, wherein the Josephson junction interrupts a superconducting loop of at least one coupling device of the one or more coupling devices;
    a plurality of superconducting wiring layers overlying the Josephson junction multi-layer, the plurality of superconducting wiring layers comprising a top superconducting wiring layer and an inner superconducting wiring layer, the plurality of superconducting wiring layers which comprise material that is superconductive in a range of critical temperatures, the top superconducting wiring layer positioned relatively outward of all other superconducting wiring layers in the plurality of superconducting wiring layers and the inner superconducting wiring layer positioned relatively inward of the top superconducting wiring layer with respect to the substrate, a first superconducting wiring layer of the plurality of superconducting wiring layers comprising at least a portion of a coupling device of the one or more coupling devices; and
    a passivating layer overlying the first superconducting layer.

2. The manufacture of claim 1 wherein the passivating layer overlying the first superconducting wiring layer comprises an insulating layer overlying the first superconducting wiring layer.

3. The manufacture of claim 2 wherein the insulating layer overlying the first superconducting wiring layer includes an oxide.

4. The manufacture of claim 1 where the passivating layer overlying the first superconducting wiring layer comprises a superconducting metal layer overlying the first superconducting wiring layer.

5. The manufacture of claim 4 wherein the superconducting metal layer overlying the first superconducting wiring layer includes aluminum.

6. The manufacture of claim 1, the Josephson junction multi-layer comprising:
- an inner superconductive layer, the inner superconductive layer comprising a material that is superconductive in a range of critical temperatures;
- a first oxide layer that overlies at least part of the inner superconductive layer; and
- a superconductive structure that overlies at least part of the oxide layer, the superconductive structure comprising a material that is superconductive in a range of critical temperatures.

7. The manufacture of claim 1, further comprising:
- at least one dielectric layer that overlies the substrate wherein the at least one dielectric layer comprises at least two dielectric materials, the at least two dielectric materials different from one another.

8. The manufacture of claim 1, further comprising:
- a first dielectric that overlies the substrate;
- a superconductive layer that overlies at least part of the first dielectric, the superconductive layer comprising a material that is superconductive in a range of critical temperatures;
- a second dielectric that overlies at least part of the superconducting layer; and
- a third dielectric that overlies at least part of the second dielectric.

9. The manufacture of claim 8 wherein at least one of the first dielectric and the third dielectric comprises silicon dioxide and the second dielectric comprises silicon nitride.

10. The manufacture of claim 1 wherein the quantum annealer is subject to flux noise arising from impurities in the first superconducting wiring layer, the flux noise which adversely affects a performance of the quantum annealer during an operation of the manufacture, and the passivating layer is selected to at least reduce the flux noise.

* * * * *